(12) United States Patent
Akutagawa et al.

(10) Patent No.: US 11,518,938 B2
(45) Date of Patent: Dec. 6, 2022

(54) OPTICAL FILM, POLARIZING PLATE, AND IMAGE DISPLAY DEVICE

(71) Applicant: FUJIFILM Corporation, Tokyo (JP)

(72) Inventors: Nobuyuki Akutagawa, Kanagawa (JP); Kunihiro Kasezawa, Kanagawa (JP); Takashi Komiyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/013,855

(22) Filed: Sep. 8, 2020

(65) Prior Publication Data

US 2020/0399538 A1 Dec. 24, 2020

Related U.S. Application Data

(63) Continuation of application No. PCT/JP2019/010665, filed on Mar. 14, 2019.

(30) Foreign Application Priority Data

Mar. 16, 2018 (JP) .............................. JP2018-050009
Jan. 29, 2019 (JP) .............................. JP2019-013119

(51) Int. Cl.
*C09K 19/56* (2006.01)
*C09K 19/38* (2006.01)
(Continued)

(52) U.S. Cl.
CPC .......... *C09K 19/3861* (2013.01); *C09K 19/56* (2013.01); *G02B 5/3016* (2013.01);
(Continued)

(58) Field of Classification Search
CPC .... C09K 19/3861; C09K 19/34; C09K 19/04; C09K 2019/0448; C09K 2323/00;
(Continued)

(56) References Cited

U.S. PATENT DOCUMENTS 9,638,849 B2  5/2017  Matsuyama et al.
2006/0141171 A1  6/2006  Tazaki et al.
(Continued)

FOREIGN PATENT DOCUMENTS

CN  104950373  9/2015
CN  105936828  9/2016
(Continued)

OTHER PUBLICATIONS

Office Action of China Counterpart Application, with partial English translation thereof, dated Sep. 30, 2021, pp. 1-6.
(Continued)

*Primary Examiner* — Ruiyun Zhang
(74) *Attorney, Agent, or Firm* — JCIPRNET

(57) ABSTRACT

An object of the present invention is to provide an optical film which is excellent in the adhesiveness between a polymer support and a photo alignment film and in which a liquid crystal compound having reverse wavelength dispersibility is uniformly aligned. The optical film is obtained by laminating, in the following order: a polymer support containing an additive; a photo alignment film; and an optically anisotropic film, wherein the optically anisotropic film is formed of a polymerizable liquid crystal composition containing a polymerizable liquid crystal compound having reverse wavelength dispersibility, and an amount of a component derived from the additive of the polymer support, which is contained in a boundary region with the optically anisotropic film in the photo alignment film is 0.10 to 0.50 mass % with respect to a total mass of the photo alignment film.

9 Claims, 3 Drawing Sheets

(51) Int. Cl.
*G02B 5/30* (2006.01)
*G02F 1/1335* (2006.01)
*H01L 51/52* (2006.01)

(52) U.S. Cl.
CPC ...... *C09K 2323/00* (2020.08); *C09K 2323/03* (2020.08); *C09K 2323/035* (2020.08); *G02F 1/133528* (2013.01); *H01L 51/5281* (2013.01)

(58) Field of Classification Search
CPC .......... C09K 2323/03; C09K 2323/035; G02B 5/3083; G02B 5/3016; G02F 1/133528; G02F 1/13363
USPC .................. 428/1.1, 1.3, 1.33; 349/117, 194
See application file for complete search history.

(56) References Cited

U.S. PATENT DOCUMENTS

| | | |
|---|---|---|
| 2009/0169810 A1 | 7/2009 | Fujita |
| 2013/0141681 A1 | 6/2013 | Takahashi et al. |
| 2013/0342793 A1 | 12/2013 | Takeda et al. |
| 2015/0346409 A1* | 12/2015 | Nagura ................ G02B 5/3083 349/96 |
| 2016/0195660 A1 | 7/2016 | Nakao |
| 2018/0246381 A1 | 8/2018 | Wakita et al. |

FOREIGN PATENT DOCUMENTS

| | | |
|---|---|---|
| JP | 2001174635 | 6/2001 |
| JP | 2006030937 | 2/2006 |
| JP | 2006133718 | 5/2006 |
| JP | 2006209098 | 8/2006 |
| JP | 2007137022 | 6/2007 |
| JP | 2012032661 | 2/2012 |
| JP | 2014029463 | 2/2014 |
| JP | 5459520 | 4/2014 |
| JP | 2015197501 | 11/2015 |
| JP | 2015203767 | 11/2015 |
| JP | 2015227955 | 12/2015 |
| JP | 2016081035 | 5/2016 |
| WO | 2015005122 | 1/2015 |
| WO | 2017069252 | 4/2017 |

OTHER PUBLICATIONS

"Office Action of Korea Counterpart Application", dated Jun. 10, 2022, with English translation thereof, pp. 1-9.
"International Search Report (Form PCT/ISA/210) of PCT/JP2019/010665," dated Jun. 11, 2019, with English translation thereof, pp. 1-5.
"Written Opinion of the International Searching Authority (Form PCT/ISA/237) of PCT/JP2019/010665," dated Jun. 11, 2019, with English translation thereof, pp. 1-7.
"Notice of Reasons for Revocation of Japan Counterpart Application" with English translation thereof, dated Oct. 26, 2022, p. 1-p. 28.

* cited by examiner

OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2019/010665 filed on Mar. 14, 2019, which claims priority under 35 U.S.C. § 119(a) to Japanese Patent Application No. 2018-050009 filed on Mar. 16, 2018 and Japanese Patent Application No. 2019-013119 filed on Jan. 29, 2019. Each of the above applications is hereby expressly incorporated by reference, in its entirety, into the present application.

BACKGROUND OF THE INVENTION

1. Field of the Invention

The present invention relates to an optical film, a polarizing plate, and an image display device.

2. Description of the Related Art

Optical films such as optical compensation sheets or retardation films are used in various image display devices in order to eliminate image coloring and to enlarge a viewing angle.

A stretched birefringence film has been used as an optical film, but due to demands for reducing a thickness and enhancing a function of the optical film, it has been proposed to use an optical film having an optically anisotropic film formed of a polymerizable liquid crystal composition containing a polymerizable liquid crystal compound instead of the stretched birefringence film.

Regarding such an optically anisotropic film, it has been known that an alignment film is previously provided on a polymer support for forming the optically anisotropic film in order to align the polymerizable liquid crystal compound, and a photo alignment film subjected to a photo alignment treatment instead of a rubbing treatment has been known as the alignment film (for example, JP5459520B and WO2014/010325A).

With the photo alignment film, it is possible to impart an alignment restriction force only by light irradiation without contact with the film. Accordingly, it is expected that planar defects caused by foreign matter on the alignment film, which have been a problem in the rubbing treatment which has been used, can be reduced. In addition, there is an advantage in that it is possible to impart an alignment restriction force in a free direction with respect to a film transport direction only by adjusting the direction of polarized light to be applied and the irradiation angle in a roll-to-roll process.

SUMMARY OF THE INVENTION

The inventors have made an attempt to provide a photo alignment film on a long polymer support having excellent optical characteristics in order to apply a photo alignment treatment to the roll-to-roll process having excellent productivity, and found that there is a problem in the adhesiveness between the polymer support and the photo alignment film.

In addition, in order to meet demands for an improvement in the display quality of display devices which have been increasing year by year, it has been proposed to use a so-called polymerizable liquid crystal compound having reverse wavelength dispersibility in which refractive index anisotropy is increased in proportion to the wavelength. However, it has been found that since the polymerizable liquid crystal compound having reverse wavelength dispersibility has a complicated molecular structure and its alignment control is difficult as compared to a polymerizable compound according to the related art, uniform alignment may not be formed in the roll-to-roll process in a case where a photo alignment film having particularly excellent adhesiveness with the polymer support is applied.

Accordingly, an object of the present invention is to provide an optical film which is excellent in the adhesiveness between a polymer support and a photo alignment film and in which a liquid crystal compound having reverse wavelength dispersibility is uniformly aligned.

Another object of the present invention is to provide a polarizing plate formed of the optical film, and an image display device formed of the optical film or the polarizing plate.

The inventors have conducted intensive studies to solve the problems, and as a result, completed the present invention through control of the amount of a component derived from a polymer support, which is extracted to a surface of a photo alignment film in the formation of the photo alignment film on the polymer support, to a constant amount.

That is, the inventors have found that the above problems can be solved by the following configuration.

[1] An optical film comprising a laminate of, in the following order: a polymer support containing an additive; a photo alignment film; and an optically anisotropic film, in which the optically anisotropic film is formed of a polymerizable liquid crystal composition containing a polymerizable liquid crystal compound having reverse wavelength dispersibility, and an amount of a component derived from the additive of the polymer support, which is contained in a boundary region with the optically anisotropic film in the photo alignment film is 0.10 to 0.50 mass % with respect to a total mass of the photo alignment film.

[2] The optical film according to [1], in which the polymerizable liquid crystal compound having reverse wavelength dispersibility is a compound represented by Formula (1) to be described later.

[3] The optical film according to [1] or [2], in which the photo alignment film is formed of a photo alignment film forming composition containing a polymer containing a crosslinkable group, and a low-molecular-weight compound having a cinnamate group, or a photo alignment film forming composition containing a polymer containing a crosslinkable group and a photo-aligned group.

[4] The optical film according to any one of [1] to [3], in which the polymer support is a cellulose acylate film containing an additive.

[5] The optical film according to [4], in which the additive is a polyester compound or a sugar ester compound.

[6] The optical film according to [4] or [5], in which in the polymer support, Re (550) is 0 to 10 nm, and Rth (550) is −10 to 15 nm.

[7] The optical film according to any one of [1] to [6], in which the optically anisotropic film is provided so as to be peelable from the photo alignment film.

[8] A polarizing plate comprising: the optical film according to any one of [1] to [7]; and a polarizer.

[9] An image display device comprising: the optical film according to any one of [1] to [7]; or the polarizing plate according to [8].

According to the present invention, it is possible to provide an optical film which is excellent in the adhesiveness between a photo alignment film and a polymer support and in which a liquid crystal compound having reverse wavelength dispersibility is uniformly aligned.

In addition, according to the present invention, it is possible to provide a polarizing plate formed of the optical film, and an image display device formed of the optical film or the polarizing plate.

DESCRIPTION OF THE PREFERRED EMBODIMENTS

Figure 1A:
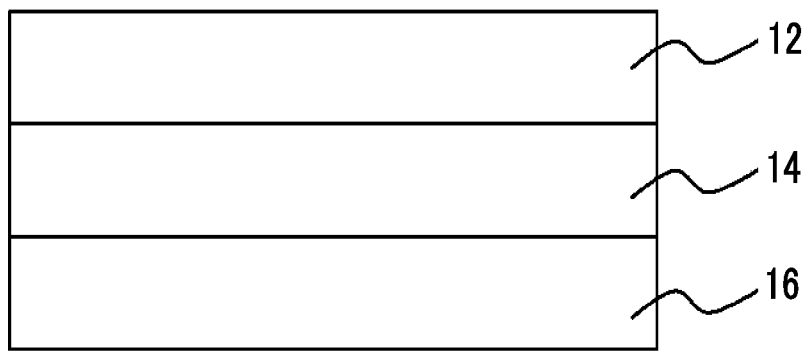
FIG. 1A is a schematic cross-sectional view showing an example of an optical film according to an embodiment of the present invention.

Hereinafter, the present invention will be described in detail.

The following description of constituent requirements is based on representative embodiments of the present invention, but the present invention is not limited thereto.

In this specification, a numerical value range expressed using "to" means a range including numerical values before and after "to" as a lower limit and an upper limit.

In this specification, the term "(meth)acryl" means "any one or both of acryl and methacryl". The term "(meth)acryloyl group" means "any one or both of acryloyl and methacryloyl".

In-plane retardation (Re (λ)) and retardation in thickness direction (Rth (λ)) are values measured using AxoScan OPMF-1 (manufactured by OPTO SCIENCE, INC.) with the use of light at a measurement wavelength.

Specifically, by inputting an average refractive index ((nx+ny+nz)/3) and a film thickness (d (μm)) into AxoScan OPMF-1, a slow axis direction (°), $Re(\lambda)=R0(\lambda)$, and $Rth(\lambda)=((nx+ny)/2-nz) \times d$ are calculated.

R0 (λ) is displayed as a numerical value calculated by AxoScan OPMF-1, and means Re (λ).

[Optical Film]

An optical film according to an embodiment of the present invention is an optical film obtained by laminating a polymer support containing an additive, a photo alignment film, and an optically anisotropic film in this order. The polymer support and the photo alignment film are in close contact with each other, and an alignment state of a liquid crystal compound in the optically anisotropic film is controlled by an alignment restriction force of the photo alignment film. The optically anisotropic film may be provided in close contact with the photo alignment film so as not to be peeled therefrom, or may be provided so as to be peelable from the photo alignment film. In a case where the optically anisotropic film is provided so as to be peelable from the photo alignment film, the optically anisotropic film can be transferred to another transfer object such as a polarizing plate.

[Polymer Support]

A polymer support contains at least a polymer and an additive. The polymer support is preferably a long polymer film from the viewpoint of being applicable to a roll-to-roll process. From the viewpoint of providing a long region exhibiting constant performance with little variation and making it a wound body for transportation, the length of the long polymer film is preferably 500 to 20,000 m, more preferably 1,000 to 15,000 m, and even more preferably 2,000 to 10,000 m.

The thickness of the polymer support is not particularly limited. However, in a case where the polymer support and the optically anisotropic film are integrally used without being separated and are applied to a display device, the thickness of the polymer support is preferably 5 to 45 μm since the thickness of the optical film can be reduced. In a case where the polymer support and the optically anisotropic film are provided so as to be peelable from each other, the thickness of the polymer support is preferably 10 to 80 μm from the viewpoint of ease of peeling and handleability.

In a case where the polymer support and the optically anisotropic film are integrally used without being separated and are applied to a display device, it is preferable that the polymer support is optically transparent, and has a total light transmittance of 80% or greater. The upper limit of the total light transmittance is, for example, 100% or less.

In addition, the optical anisotropy of the polymer support can be optionally set, and preferable examples thereof include an embodiment in which in-plane retardation (Re (550)) at a wavelength of 550 nm is 0 to 10 nm, and retardation (Rth (550)) in thickness direction at a wavelength of 550 nm is −10 to 15 nm.

In the manufacturing of the optical film according to the embodiment of the present invention, the glass transition temperature of the polymer support is preferably 125° C. or higher, and more preferably 140° C. or higher since the polymer support can be heated in the formation of the photo alignment film and in the formation of the optically anisotropic film. Such a polymer support makes it possible to obtain a uniform optical film having high quality without being deformed or wrinkled even under transport tension in a roll-to-roll process. The upper limit is not particularly limited, but generally available transparent polymer supports have a glass transition temperature of 200° C. or lower in many cases.

In this specification, in a differential scanning calorimeter (X-DSC7000 (manufactured by IT KEISOKU SEIGYO K.K.)), 20 mg of a polymer support sample was put into a measurement pan, kept for 15 minutes with a temperature increase from 30° C. to 120° C. at a rate of 10° C./min in a nitrogen stream, and then cooled to 30° C. at −20° C./min. Then, the temperature was increased again from 30° C. to 250° C., and the temperature at which the baseline starts to be biased from the low temperature side is defined as a glass transition temperature Tg.

<Polymer>

Specific examples of the constituent polymer of the polymer support include cellulose-based polymers; acrylic polymers such as acrylic polymers having an acrylic acid ester polymer such as polymethylmethacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl alcohol-based polymers; vinyl butyral-based polymers; arylate-based polymers; polyoxymethylene-based polymers; epoxy-based polymers; and polymers obtained by mixing the above polymers.

As the constituent polymer of the polymer support, acrylic polymers, thermoplastic norbornene-based polymers, polycarbonate-based polymers, or cellulose-based polymers typified by triacetyl cellulose (hereinafter, also referred to as "cellulose acylate") are preferable among the above examples from the viewpoint of transparency and heat resistance. Among these, cellulose-based polymers are more preferable from the viewpoint of their particularly excellent heat resistance and transparency.

<Additive>

The polymer support contains an additive.

The term "additive" as mentioned herein refers to a compound added to modify the above-described constituent polymer of the polymer support, and/or to enhance the function of the film, and examples thereof include a plasticizer, an ultraviolet (UV) absorber, an optical anisotropy increasing agent, an optical anisotropy reducing agent, a hydrophobizing agent, and a durability improving agent.

From the viewpoint of compatibility with the polymer described above, the molecular weight of these additives is typically 100 to 5,000, preferably 300 to 3,000, and more preferably 700 to 2,000.

The compound which can be used as an additive and its function vary according to the constituent polymer of the polymer support. Accordingly, combinations of polymers and additives which can be used in the polymer support will be described in detail for each polymer type.

(Cellulose Acylate Film)

A cellulose acylate film can be used as a preferable embodiment of the polymer support. Cellulose acylate is a material in which a hydroxyl group of cellulose is acylated, and as a substituent thereof, any of acyl groups having 2 (acetyl group) to 22 carbon atoms can be used.

The acyl group having 2 to 22 carbon atoms for substitution for the hydroxyl group of cellulose is not particularly limited. The above acyl group may be an aliphatic group or an aromatic group, and may be a single kind of group or a mixture of two or more kinds. Examples of the cellulose acylate in which the above groups are provided for substitution include an alkylcarbonyl ester of cellulose, an alkenylcarbonyl ester of cellulose, an aromatic carbonyl ester of cellulose, and an aromatic alkylcarbonyl ester of cellulose, each of which may further have a substituent.

Preferable examples of the acyl group include an acetyl group, a propionyl group, a butanoyl group, a benzoyl group, a naphthylcarbonyl group, and a cinnamoyl group. Among these, an acetyl group, a propionyl group, a butanoyl group, a benzoyl group, a naphthylcarbonyl group, or a cinnamoyl group is preferable, and an acetyl group, a propionyl group, or a butanoyl group is more preferable. Particularly, an acetyl group or a propionyl group is even more preferable, and an acetyl group is particularly preferable from the viewpoint of ease of synthesis, cost, and ease of control of substituent distribution. In a case where two or more kinds of acyl groups are provided for substitution, a combination of an acetyl group and a propionyl group is preferable.

In the cellulose acylate, the acyl substitution degree to the hydroxyl group of cellulose is not particularly limited. However, in a case where the cellulose acylate is used for a polarizing plate protective film or an optical film, the acyl substitution degree is preferably high for good compatibilization of various additives. Accordingly, the acyl substitution degree (total degree of substitution) to the hydroxyl group of cellulose is preferably 2.50 to 3.00, more preferably 2.70 to 2.96, and even more preferably 2.80 to 2.95. In a case where only an acetyl group is provided for substitution in the cellulose acylate, the degree of substitution of the acetyl groups is preferably 2.70 to 2.96, and more preferably 2.80 to 2.95. In a case where only a propionyl group is provided for substitution in the cellulose acylate, the degree of substitution of the propionyl group is preferably 0.20 to 2.60.

Examples of the method of measuring a degree of substitution (acyl substitution degree) of an acetic acid and/or a fatty acid having 3 to 22 carbon atoms for substitution for the hydroxyl group of cellulose in the cellulose acylate include a method according to ASTM D-817-91 and a nuclear magnetic resonance (NMR) method.

In the cellulose acylate film, as the cellulose acylate, a single kind of cellulose acylate or a mixture of two or more different kinds of cellulose acylates can be used from the viewpoint of the degree of substitution, the degree of polymerization, and the molecular weight distribution.

Examples of the additive contained in the cellulose acylate film include a plasticizer, a hydrophobizing agent, an ultraviolet absorber, and a retardation adjusting agent. More specific examples of the additive include a polyester oligomer, a sugar ester compound, and a phosphoric acid ester compound. In a case where the film also functions as a polarizer protective film as will be described later, a polyester oligomer and a sugar ester compound are preferable from the viewpoint of excellent moisture-heat resistance.

The polyester oligomer has a repeating unit formed of a dicarboxylic acid and a diol, and can be synthesized by a known method such as a dehydration condensation reaction of a dicarboxylic acid and a diol, addition of dicarboxylic anhydride to a diol, or a dehydration condensation reaction of dicarboxylic anhydride and a diol.

As the dicarboxylic acid, an aliphatic dicarboxylic acid or an aromatic dicarboxylic acid can be used. Examples of the aliphatic dicarboxylic acid include an oxalic acid, a malonic acid, a succinic acid, a maleic acid, a fumaric acid, a glutaric acid, an adipic acid, and a 1,4-cyclohexanedicarboxylic acid. Examples of the aromatic dicarboxylic acid include a phthalic acid, an isophthalic acid, a terephthalic acid, and a 1,4-naphthalenedicarboxylic acid.

Examples of the diol (glycol) include aliphatic or alicyclic diols having 2 to 12 carbon atoms, alkyl ether diols having 4 to 20 carbon atoms, and aromatic ring-containing diols having 6 to 20 carbon atoms, and two or more kinds selected from the above examples may be used in combination. The number of carbon atoms of the aromatic diol is preferably 6 to 12.

At least one of both terminals of the polyester oligomer is preferably blocked. The above terminal is preferably at least one selected from an aliphatic group having 1 to 22 carbon atoms, an aromatic ring-containing group having 6 to 20 carbon atoms, an aliphatic carbonyl group having 1 to 22 carbon atoms, or an aromatic carbonyl group having 6 to 20 carbon atoms.

In a case where both terminals are blocked, the polyester oligomer is unlikely to be in a solid form at room temperature, and handling is improved. As a result, a polymer film having excellent humidity stability and polarizing plate durability can be obtained.

In the cellulose acylate film, the content of the polyester oligomer as an additive (in a case where a plurality of polyester oligomers are contained, the total content thereof) is preferably 1 to 30 mass %, more preferably 5 to 20 mass %, and even more preferably 5 to 15 mass % with respect to the cellulose acylate.

The sugar ester compound refers to a compound in which at least one substitutable group (for example, a hydroxyl group or a carboxyl group) in the sugar skeleton structure of the compound is ester-bonded with at least one kind of substituent. That is, the sugar ester compound mentioned herein includes broad-sense sugar derivatives, and also includes compounds such as a gluconic acid, containing a sugar residue as a structure. That is, the sugar ester compound also includes esters between glucose and carboxylic acid and esters between gluconic acid and alcohol.

The sugar ester compound is preferably a sugar ester compound in which all or a part of OH groups of a compound (M) having one furanose structure or pyranose structure is alkyl-esterified, or a sugar ester compound in which all or a part of OH groups of a compound (D), in which two furanose structures and/or two pyranose structures are bonded together, is alkyl-esterified. The sugar ester compound is more preferably a sugar ester compound which is monocyclic with a furanose structure or a pyranose structure and in which all or a part of hydroxyl groups of the structure is alkyl-esterified, and even more preferably a sugar ester compound in which all or a part of hydroxyl groups of the glucose structure is alkyl-esterified.

Examples of the compound (M) include glucose, galactose, mannose, fructose, xylose, and arabinose. Glucose or fructose is preferable, and glucose is more preferable.

Examples of the compound (D) include lactose, sucrose, nystose, 1F-fructosyl nystose, stachyose, maltitol, lactitol, lactulose, cellobiose, maltose, cellotriose, maltotriose, raffinose, and kestose. Examples of the compound (D) also include gentiobiose, gentiotriose, gentiotetraose, xylotriose, and galactosylsucrose.

Among these compounds (D), particularly, a compound having both a furanose structure and a pyranose structure is preferable, sucrose, kestose, nystose, 1F-fructosyl nystose, or stachyose is more preferable, and sucrose is even more preferable.

An aliphatic monocarboxylic acid is preferably used to alkyl-esterify all or a part of OH groups in the compounds (M) and (D).

Examples of the aliphatic monocarboxylic acid include saturated fatty acids such as an acetic acid, a propionic acid, a butyric acid, an isobutyric acid, a valeric acid, a caproic acid, an enanthic acid, a caprylic acid, a pelargonic acid, a capric acid, a 2-ethyl-hexanecarboxylic acid, an undecylic acid, a lauric acid, a tridecylic acid, a myristic acid, a pentadecylic acid, a palmitic acid, a heptadecylic acid, a stearic acid, a nonadecanoic acid, an arachic acid, a behenic acid, a lignoceric acid, a cerotic acid, a heptacosanoic acid, a montanoic acid, a melissic acid, and a lacceric acid; and unsaturated fatty acids such as an undecylenic acid, an oleic acid, a sorbic acid, a linoleic acid, a linolenic acid, an arachidonic acid, and an octenoic acid, and among these, an acetic acid, a propionic acid, or an isobutyric acid is preferable. That is, the substituent in the sugar ester compound is preferably an acetyl group, a propionyl group, or an isobutyryl group.

As the aliphatic monocarboxylic acid which is used to alkyl-esterify all or a part of the OH groups described above, two or more kinds of aliphatic monocarboxylic acids may be used, and at least one kind of aliphatic monocarboxylic acid is preferably a branched aliphatic monocarboxylic acid. An isobutyric acid is preferable as the branched aliphatic monocarboxylic acid.

Specifically, all or a part of the OH groups described above are preferably esterified with an acetic acid and an isobutyric acid. In other words, the substituents in the sugar ester compound are preferably an acetyl group and an isobutyryl group. In a case where only an acetyl group and an isobutyryl group constitute the substituents, the ratio of acetyl group to isobutyryl group is preferably 1/7 to 4/4, more preferably 1/7 to 3/5, and even more preferably 2/6.

The method of manufacturing an aliphatic sugar ester compound substituted with the aliphatic monocarboxylic acids is described in, for example, JP1996-245678A (JP-H8-245678A).

In the cellulose acylate film, the content of the additive described above (in a case where a plurality of additives are contained, the total content thereof) is preferably 5 to 20 mass % with respect to the cellulose acylate.

In a case where the optical film according to the embodiment of the present invention is attached to a polarizer on the polymer support side, a compound represented by Formula (4) can be added to the cellulose acylate film to be used from the viewpoint of suppressing deterioration of the polarizer by hygrothermal aging.

Formula (4)

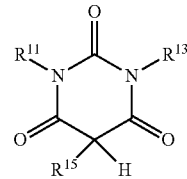

In Formula (4), $R^{11}$, $R^{13}$, and $R^{15}$ each independently represent a hydrogen atom, an alkyl group having 1 to 20 carbon atoms, a cycloalkyl group having 3 to 20 carbon atoms, an alkenyl group having 2 to 20 carbon atoms, an aralkyl group having 1 to 20 carbon atoms, or an aromatic group having 6 to 20 carbon atoms.

Regarding these compounds and the synthesis method thereof, the contents of JP2013-174861A (as the compounds, the compounds described in paragraphs 0090 to 0122 of JP2013-174861A can be used) can be referred to.

In a case where the cellulose acylate film contains the compound represented by Formula (4), the content of the compound represented by Formula (4) is preferably 1 to 20 mass % with respect to the cellulose acylate polymer.

The cellulose acylate film preferably contains fine particles as a matting agent. As the fine particles, silicon dioxide, titanium dioxide, aluminum oxide, zirconium oxide, calcium carbonate, talc, clay, calcined kaolin, calcined calcium silicate, hydrated calcium silicate, aluminum silicate, magnesium silicate, calcium phosphate, and the like can be used.

The fine particles preferably have a primary average particle diameter of 20 nm or less and an apparent specific gravity of 70 g/L or greater. The fine particles usually form secondary particles having an average particle diameter of 0.1 to 3.0 µm, and form irregularities of 0.1 to 3.0 µm on the film surface. Accordingly, in a case where the optical film according to the embodiment of the present invention is formed into a long wound body in a roll-to-roll process, deterioration of quality due to the rubbing between the films and/or a phenomenon in which the films adhere to each other (also referred to as blocking) can be prevented from occurring.

The fine particles may be added such that both surfaces of the cellulose acylate film are provided with irregularities, and from the demand for making the surface of a photo alignment film flat to control the alignment of the optically anisotropic film, the fine particles are preferably added such that irregularities are provided only on the surface of the cellulose acylate film opposite to the side on which the photo alignment film is provided.

(Acrylic Resin Film)

An acrylic resin film can be used as another preferable embodiment of the polymer support. As the acrylic resin, for example, a (meth)acrylic resin having a cyclic structure in a main chain can be used in view of excellent heat resistance as well as polymethylmethacrylate (PMMA). Examples of the (meth)acrylic resin having a cyclic structure in a main chain include (meth)acrylic resins having a lactone ring structure, (meth)acrylic resins having a glutarimide ring structure, (meth)acrylic resins having a glutaric anhydride ring structure, (meth)acrylic resins having a maleic anhydride ring structure, and (meth)acrylic resins having a maleimide ring structure.

Regarding the (meth)acrylic resins having a lactone ring structure, the synthesis method described in JP2000-230016A, JP2001-151814A, JP2002-120326A, JP2002-254544A, JP2005-146084A, or JP2006-171464A, and those manufactured by the above methods can be used.

Regarding the (meth)acrylic resins having a glutarimide ring structure, the synthesis method described in WO05/054311A, WO05/108438A, JP2010-261025A, JP2010-270162A, JP2010-284840A, JP2011-088440A, JP2011-138119A, JP2011-245624A, or the like, and those manufactured by the above methods can be used.

Examples of the additive which can be contained in the acrylic resin film include a plasticizer, a hydrophobizing agent, an ultraviolet absorber, a retardation adjusting agent, a deterioration preventing agent (for example, an antioxidant, a peroxide decomposer, a radical inhibitor, a metal deactivator, an acid trapping agent, and an amine), and the compound represented by Formula (4) described above. Particularly, in a case where an acrylic resin film is produced using a melt extrusion method, a deterioration preventing agent is preferably used.

The deterioration preventing agent is described in JP1991-199201A (JP-H3-199201A), JP1993-197073A (JP-H5-197073A), JP1993-194789A (JP-H5-194789A), JP1993-271471A (JP-H5-271471A), and JP1994-107854A (JP-H6-107854A). The content of the deterioration preventing agent is preferably 0.01 to 1 mass %, and more preferably 0.01 to 0.2 mass % with respect to the solution (dope) to be prepared. The content of the deterioration preventing agent in the solution (dope) to be prepared is preferably 0.01 mass % or greater since the effect of the deterioration preventing agent is sufficiently exhibited. In addition, the above content is preferably 1 mass % or less since bleed-out (bleeding) of the deterioration preventing agent to the film surface hardly occurs. Butylated hydroxytoluene (BHT) or tribenzylamine (TBA) is preferable as the deterioration preventing agent.

[Photo Alignment Film]

The photo alignment film of the optical film according to the embodiment of the present invention is formed on the polymer support by using a photo alignment film forming composition, and the optically anisotropic film is disposed on the surface opposite to the polymer support.

The amount of the component derived from the additive of the polymer support described above, which is contained in a boundary region on the optically anisotropic film side in the photo alignment film, is 0.10 to 0.50 mass % with respect to the total mass of the photo alignment film.

The amount of the component derived from the additive of the polymer support described above, which is contained in the boundary region with the optically anisotropic film in the photo alignment film is obtained by the following method for analyzing the boundary region with the optically anisotropic film in the photo alignment film by secondary ion mass spectrometry.

First, the boundary region with the optically anisotropic film in the photo alignment film is analyzed by secondary ion mass spectrometry. Then, the secondary ion peak value derived from the additive (hereinafter, also referred to as "additive component") of the polymer support is divided by a total amount of ions detected, and thus a standardized secondary ion amount of the additive component is obtained. A mass ratio of the additive component to other photo alignment film components is calculated using a calibration curve obtained separately. From the calculated numerical value, the amount (mass %) of the component derived from the additive component contained in the boundary region with the optically anisotropic film in the photo alignment film with respect to the total mass of the photo alignment film is obtained.

Figure 1B:
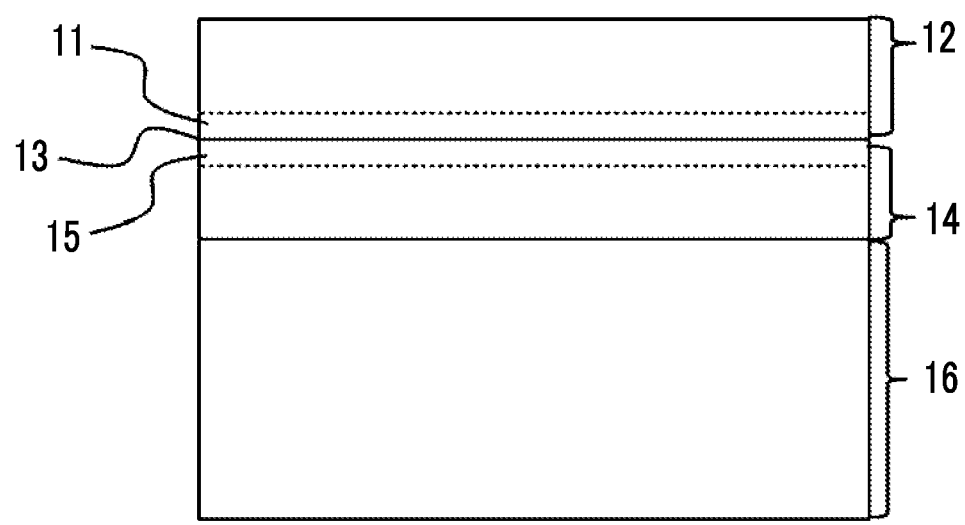
FIG. 1B is a conceptual diagram illustrating a boundary region between a photo alignment film and an optically anisotropic film in the schematic cross-sectional view shown in FIG. 1A in particular detail.

In the optical film according to the embodiment of the present invention, in a case where the optically anisotropic film is provided so as to be peelable from the photo alignment film, the surface of the photo alignment film exposed after the optically anisotropic film is peeled and removed is subjected to the secondary ion mass spectrometry to obtain a standardized secondary ion amount derived from the additive component existing in the boundary region on the optically anisotropic film side in the photo alignment film. In a case where peeling is not possible between the photo alignment film and the optically anisotropic film in the optical film according to the embodiment of the present invention, a region is specified in the manner shown in FIG. 1B in a cross section (which may be a cut surface made by oblique cutting as necessary) of the optical film, and the secondary ion mass spectrometry profile of the cross section or the cut surface is measured to obtain a standardized secondary ion amount derived from the additive component existing in the boundary region on the optically anisotropic film side in the photo alignment film.

The boundary region on the optically anisotropic film side in the photo alignment film refers to a region from the boundary line which is optically observed between the photo alignment film and the optically anisotropic film to a depth of about 50 nm. Specifically, in FIG. 1B, a boundary region 15 on the optically anisotropic film side in the photo alignment film refers to a region from a boundary line 13 which is optically observed between the photo alignment film and the optically anisotropic film to a depth of about 50 nm.

Although details are unclear, the mechanism by which the reverse dispersion liquid crystal alignment compound which has excellent adhesiveness and forms an optically anisotropic film is uniformly aligned by forming the photo alignment film as described above, which has been thought by the inventors, is as follows.

It is presumed that in the formation of the photo alignment film, the photo alignment film forming composition is applied to the polymer support as will be described later, and in this case, the solvent contained in the coating film swells the surface of the polymer support, and thus the component of the photo alignment film is entangled with the constituent polymer of the polymer support, and the adhesiveness is increased. It is thought that during the swelling, a part of the additive contained in the polymer support is also extracted to the coating film side, and thus mixing a certain amount of the component derived from the polymer support into the photo alignment film is an index to ensure the adhesiveness between the polymer support and the photo alignment film.

Meanwhile, it is presumed that in the application of a polymerizable liquid crystal composition for forming the optically anisotropic film to the photo alignment film, in a case where the photo alignment film itself is crosslinked, the photo alignment film is insoluble in the solvent contained in the polymerizable liquid crystal composition, but the component derived from the polymer support contained therein diffuses into the coating film of the polymerizable liquid crystal composition.

On the assumption that in a case where the concentration of the component derived from the polymer support in the boundary region on the side of the coating film of the polymerizable liquid crystal composition in the photo alignment film is sufficiently reduced due to the sufficiently low content of the component derived from the polymer support contained originally in the photo alignment film, or rapid diffusion of the component derived from the polymer support to the coating film of the polymerizable liquid crystal composition, no influence is found on the alignment, but in a case where the process proceeds with a high concentration of the component derived from the polymer support in the boundary region on the side of the coating film of the polymerizable liquid crystal composition in the photo alignment film, the alignment state is adversely affected at the stage of forming the alignment of the liquid crystal compound, the inventors have conducted intensive studies on the distribution of the component derived from the polymer support in the film and the control factors thereof, and as a result, completed the present invention.

The film thickness of the photo alignment film can be appropriately selected according to the material and the purpose, but is preferably 50 to 1,000 nm, and more preferably 50 to 700 nm. In a case where the film thickness is within the above range, the light reflected by the upper and lower surfaces does not interfere with each other to cause exposure unevenness. In addition, a sufficient alignment restriction force can be imparted, and thus uniform alignment can be realized in the liquid crystal compound which forms the optically anisotropic film.

<Photo Alignment Film Forming Composition>

A known composition can be used as the photo alignment film forming composition used in the present invention. The photo alignment film forming composition is preferably selected from the viewpoint of adhesiveness with the polymer support and wettability with the polymerizable liquid crystal composition. In addition, the photo alignment film forming composition is preferably crosslinkable from the viewpoint of an alignment restriction force and excellent adhesiveness with the base material.

Examples of the photo alignment film forming composition include a photo alignment film forming composition containing a polymer containing a crosslinkable group and a low-molecular-weight compound having a photo-aligned group, and a photo alignment film forming composition containing a polymer containing a crosslinkable group and a photo-aligned group.

Examples of the photo alignment film forming composition containing a polymer containing a crosslinkable group and a low-molecular-weight compound having a photo-aligned group include a photo alignment film forming composition containing a polymer containing a repeating unit containing a crosslinkable group and a low-molecular-weight compound having a cinnamate group.

Examples of the photo alignment film forming composition containing a polymer containing a crosslinkable group and a photo-aligned group include a photo alignment film forming composition containing a polymer containing a repeating unit containing a crosslinkable group and a repeating unit containing a cinnamate group. The photo alignment film forming composition according to the above embodiment may or may not contain a low-molecular-weight compound having a photo-aligned group.

Here, in this specification, the cinnamate group refers to a group having a cinnamic acid structure containing a cinnamic acid or a derivative thereof as a basic skeleton, represented by Formula (I) or Formula (II).

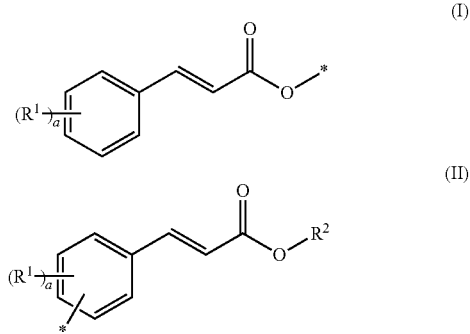

In Formulae (I) and (II), a represents an integer of 0 to 5, $R^1$ represents a monovalent organic group, and * represents a bonding position. In a case where a is 2 or more, a plurality of $R^1$'s may be the same or different from each other. In Formula (II), $R^2$ represents a monovalent organic group.

Examples of the monovalent organic group represented by $R^1$ and $R^2$ in Formulae (I) and (II) include a linear, branched, or cyclic alkyl group having 1 to 20 carbon atoms, an alkoxy group having 1 to 20 carbon atoms, and an aryl group having 6 to 20 carbon atoms which may have a substituent.

Hereinafter, a preferable embodiment of the photo alignment film forming composition will be described.

The photo alignment film forming composition is preferably a photo alignment film forming composition containing a polymer Ap containing a crosslinkable group and a low-molecular-weight compound B having a cinnamate group, or a photo alignment film forming composition containing a polymer Ap' containing a crosslinkable group and a photo-aligned group.

Hereinafter, the polymer Ap containing a crosslinkable group (hereinafter, also simply referred to as "polymer Ap") will be described. The polymer Ap containing a crosslinkable group preferably further contains a photo-aligned group. That is, the polymer Ap containing a crosslinkable group is preferably a polymer Ap' containing a crosslinkable group and a photo-aligned group.

Hereinafter, the polymer Ap, the low-molecular-weight compound B having a cinnamate group, and other additive components will be described.

(Polymer Ap Having Crosslinkable Group (Polymer Ap))

The polymer Ap is not particularly limited as long as it contains a crosslinkable group, and a polymer which has been known can be used. Specific examples of the polymer Ap include a polymer containing a repeating unit containing a crosslinkable group (hereinafter, also referred to as "crosslinkable group-containing repeating unit a1").

Examples of the main skeleton of the polymer Ap include a skeleton formed by polyamic acid, polyamic acid ester, polyimide, polyorganosiloxane, (meth)acrylic polymer, cycloolefin-based polymer, polyester, polyamide, polyacetal derivative, polystyrene derivative, or poly(styrene-phenylmaleimide) derivative. Particularly, in a case where an alignment layer is provided on the resin film, at least one selected from the group consisting of a (meth)acrylic polymer and a polyorganosiloxane is preferable in view of excellent solvent solubility and film handleability.

The molecular weight of the polymer Ap is preferably 1,000 to 500,000, more preferably 2,000 to 300,000, and even more preferably 3,000 to 200,000 in terms of mass average molecular weight from the viewpoint of solvent solubility and viscosity of the solution during the coating, and exhibition and maintenance of the alignment restriction force after the alignment treatment.

Here, the mass average molecular weight is defined as a value converted in terms of polystyrene (PS) by gel permeation chromatography (GPC) measurement. In the present invention, specifically, the measurement by GPC is performed by HLC-8220GPC (manufactured by Tosoh Corporation) with the use of TSKgel Super HZM-H, HZ4000, HZ2000 as columns.

As will be described later, the polymer Ap preferably further contains a photo-aligned group, more preferably a cinnamate group, and even more preferably a repeating unit containing a cinnamate group (hereinafter, also referred to as "cinnamate-containing repeating unit a2").

Furthermore, as will be described later, the polymer Ap may further contain a repeating unit other than the crosslinkable group-containing repeating unit a1 and the cinnamate-containing repeating unit a2.

Hereinafter, the crosslinkable group-containing repeating unit a1, the cinnamate-containing repeating unit a2, and other repeating units will be described.

«Crosslinkable Group-Containing Repeating Unit a1»

The crosslinkable group-containing repeating unit a1 is not particularly limited, and for example, in a case of a (meth)acrylic polymer or polyorganosiloxane, a repeating unit represented by Formula (A1) or (A2) is preferable.

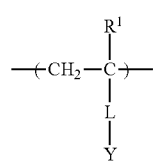

(A1)

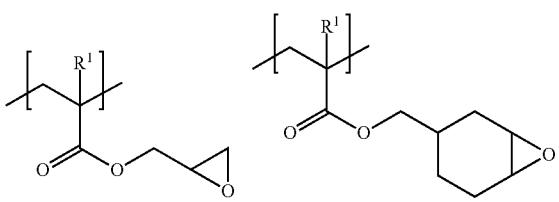

(A2)

In Formula (A1), $R^1$ represents a hydrogen atom or a methyl group. In Formula (A2), $R^2$ represents bonding to a silicon atom via an alkyl group having 1 to 6 carbon atoms, an alkoxy group having 1 to 6 carbon atoms, or an oxygen atom. In Formulae (A1) and (A2), L represents a single bond or a divalent linking group, and Y represents a crosslinkable group to be described later.

Specific examples of the alkyl group having 1 to 6 carbon atoms for $R^2$ in Formula (A2) include a methyl group, an ethyl group, an n-propyl group, an isopropyl group, and an n-butyl group. Among these, a methyl group or an ethyl group is preferable. Specific examples of the alkoxy group having 1 to 6 carbon atoms for $R^2$ include a methoxy group, an ethoxy group, an n-propyloxy group, an isopropyloxy group, and an n-butoxy group. Among these, a methoxy group or an ethoxy group is preferable.

Specific examples of the divalent linking group represented by L In Formulae (A1) and (A2) include —CO—, —O—CO—, —O—CO—$(CH_2)_n$—O—, —CO—O-Ph-, —CO—O-Ph-Ph-, —CO—O—$(CH_2)_n$—, and —$(CH_2)_n$-Cy-. Here, Ph represents a divalent benzene ring (for example, a phenylene group or the like) which may have a substituent, and examples of Cy include a divalent cyclohexane ring (for example, a cyclohexane-1,4-diyl group) which may have a substituent. n represents an integer of 1 to 4. In Formulae (A1) and (A2), the bonding direction of the divalent group (for example, —CO—O—) represented by L is not limited unless otherwise specified. For example, in a case where L is —CO—O—, the connection form between L and a carbon atom and Y adjacent thereto may be carbon atom-CO—O—Y, or Y—O—CO-carbon atom.

Examples of the crosslinkable group Y include groups including a crosslinking functional group, such as an epoxy group, an oxetanyl group, an amino group, a carboxyl group, a hydroxyl group, a group represented by —NH—$CH_2$—O—R (R represents a hydrogen atom or an alkyl group having 1 to 20 carbon atoms), an ethylenically unsaturated group, and a blocked isocyanate group. Among these, an epoxy group, an oxetanyl group, or a 3,4-epoxycyclohexyl group is preferable, and an epoxy group or an oxetanyl group is more preferable as the crosslinkable group Y. A 3-membered cyclic ether group is also called an epoxy group, and a 4-membered cyclic ether group is also called an oxetanyl group.

Specific examples of the repeating unit represented by Formula (A1) or (A2) include the following repeating units.

In the following specific examples, $R^1$ and $R^2$ are synonymous with $R^1$ and $R^2$ in Formulae (A1) and (A2) described above, respectively.

-continued

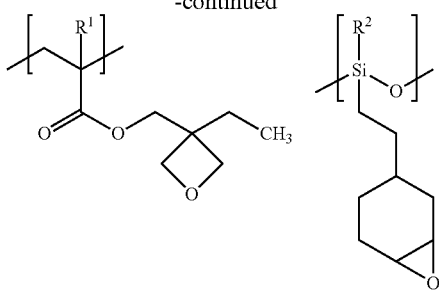

By appropriately setting the content of the crosslinkable group in the polymer Ap, extraction of the component derived from the additive of the polymer support and diffusion in the coating film can be controlled.

«Cinnamate Group-Containing Repeating Unit a2»

Examples of the cinnamate group-containing repeating unit a2 include those in which Y represents various cinnamate groups instead of the crosslinkable group in the repeating unit represented by Formula (A1) or (A2) described above.

Specific examples of the cinnamate group include the following groups described in paragraph [0016] of JP2015-026050A. In the following structures, * represents a bonding position with L. In a case where Y represents a cinnamate group shown below instead of the crosslinkable group in the repeating unit represented by Formula (A1) or (A2), L in Formula (A1) or (A2) preferably represents a single bond.

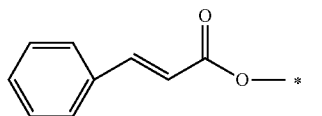
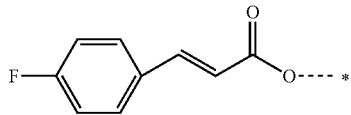
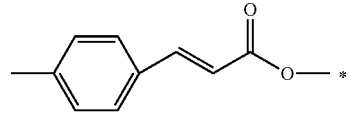
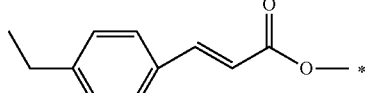
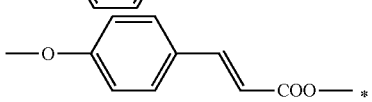
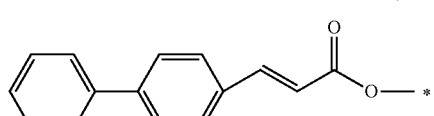
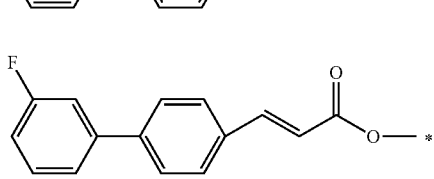

-continued

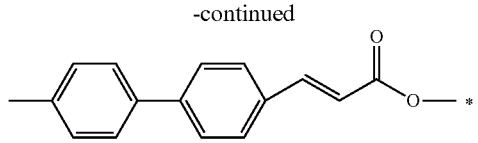
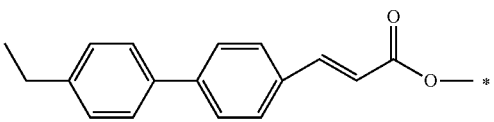
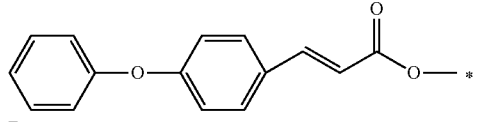
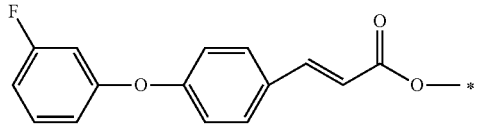
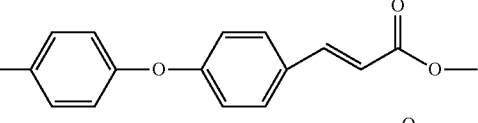
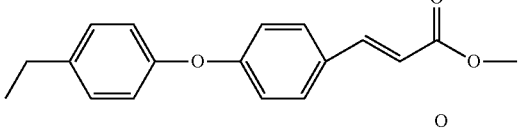
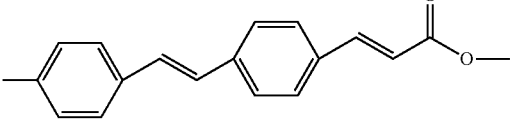
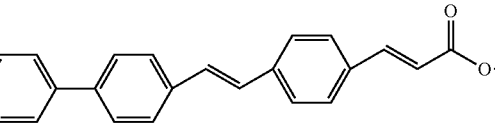
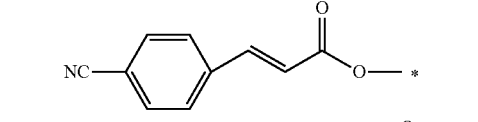
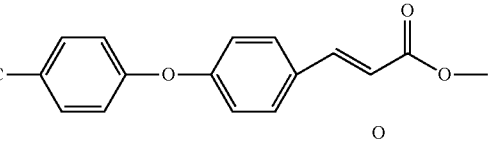
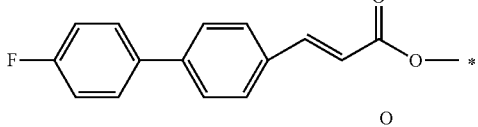
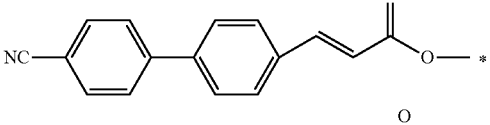
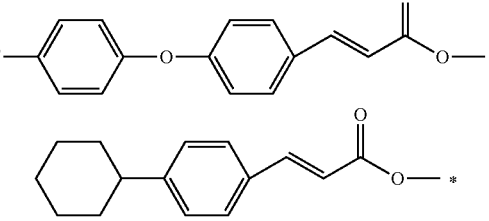

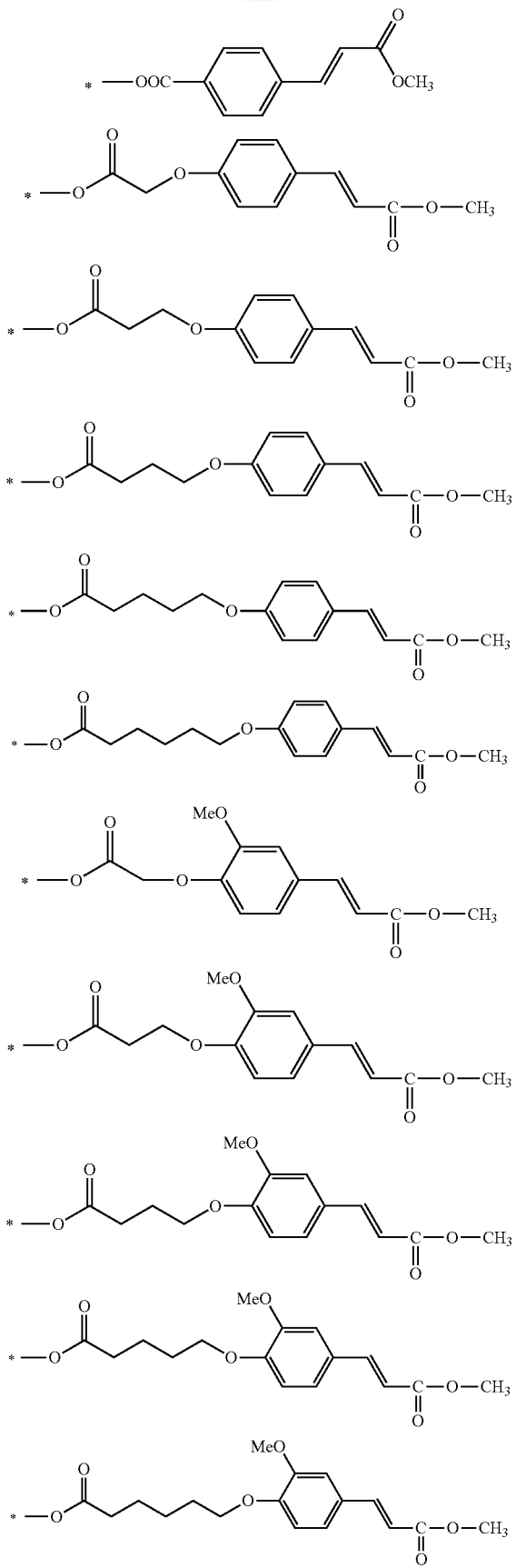
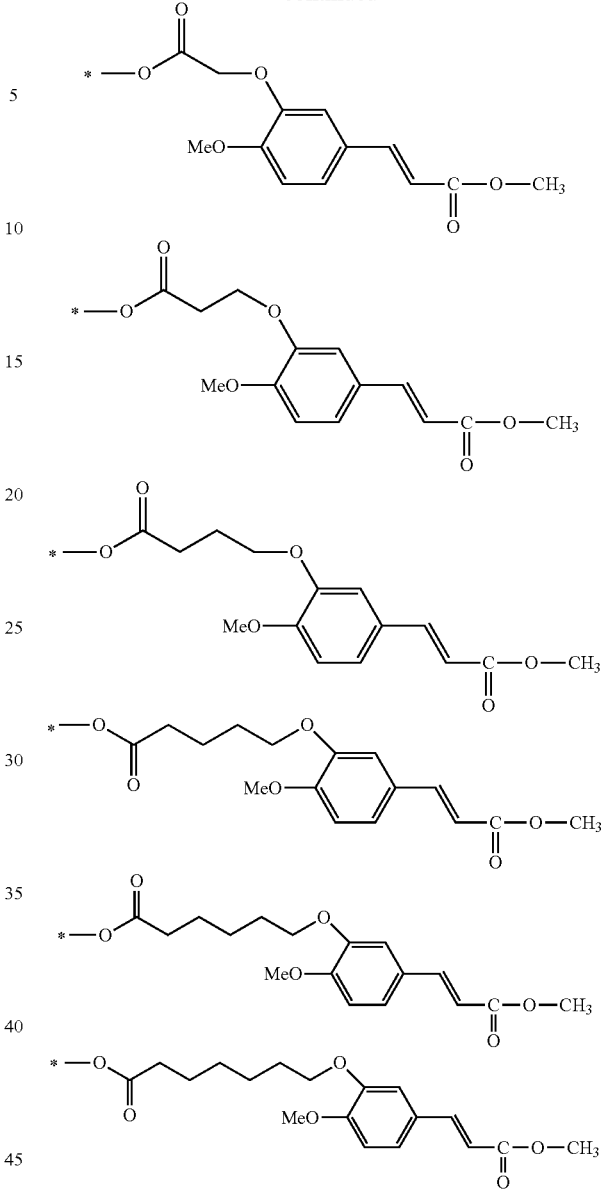

«Other Repeating Units»

The polymer Ap may have a repeating unit other than the repeating units a1 and a2 described above. In a case where the copolymer contains other repeating units, for example, adhesiveness to a base material, solvent solubility, heat resistance, and the like can be improved.

As other repeating units which can be contained in the polymer Ap, a repeating unit containing a functional group which adjusts the polarity of the polymer Ap is preferable from the viewpoint of adhesiveness to a base material and solvent solubility. Specifically, from the viewpoint of imparting hydrophilicity, a repeating unit containing a hydroxyl group, a carboxylic acid group, or an ionic group is preferable, and from the viewpoint of imparting lipophilicity, a repeating unit containing a higher alkyl group or an aromatic group is preferable. From the viewpoint of a balance between adhesiveness to a base material and solvent solubility, a repeating unit containing a 5- or more membered heterocyclic ring, a cyclic ketone, or an aromatic ring is preferable. From the viewpoint of increasing heat resistance, a repeating unit containing a rigid structure is preferable.

In a case where the photo alignment film is brought into close contact with the optically anisotropic film to be described later, a repeating unit containing a functional group which can react with a component contained in the polymerizable liquid crystal composition is preferable.

In a case where the photo alignment film forming composition contains an organic solvent to be described later, the content of the polymer Ap in the photo alignment film forming composition is preferably 0.1 to 50 parts by mass, and more preferably 0.5 to 10 parts by mass with respect to 100 parts by mass of the solvent from the viewpoint of adjusting the viscosity of the coating liquid to a viscosity suitable for a roll-to-roll process.

(Low-Molecular-Weight Compound B Having Cinnamate Group)

The low-molecular-weight compound B having a cinnamate group (hereinafter, also referred to as "low-molecular-weight compound B") is preferably a compound having a cinnamate group and having a smaller molecular weight than the polymer Ap. Particularly, in a case where the polymer Ap contains a cinnamate group, the alignment property of a photo alignment film to be produced is improved in a case where the photo alignment film forming composition contains the low-molecular-weight compound B.

In a case where the polymer Ap contains no cinnamate group, it is preferable that a compound which has a cinnamate group, has a smaller molecular weight than the polymer Ap, and is bondable with a crosslinkable group of the polymer Ap is used as the low-molecular-weight compound B, and a reaction product thereof is used as a photo alignment film.

The molecular weight of the low-molecular-weight compound B is not particularly limited, and from the viewpoint of ensuring the solubility and the alignment restriction force, the molecular weight is preferably 200 to 1,000, and more preferably 250 to 700.

Examples of the low-molecular-weight compound B include a compound represented by Formula (B1).

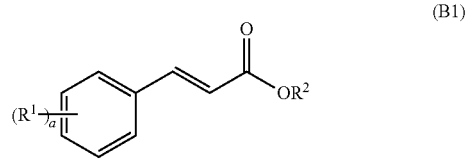

(B1)

In Formula (B1), a represents an integer of 0 to 5, $R^1$ represents a monovalent organic group, and $R^2$ represents a monovalent organic group. In a case where a is 2 or more, a plurality of $R^1$'s may be the same or different from each other.

Examples of the monovalent organic group represented by $R^1$ include a linear, branched, or cyclic alkyl group having 1 to 20 carbon atoms, an alkoxy group having 1 to 20 carbon atoms, and an aryl group having 6 to 20 carbon atoms which may have a substituent. Among these, an alkoxy group having 1 to 20 carbon atoms is preferable, an alkoxy group having 1 to 6 carbon atoms is more preferable, and a methoxy group or an ethoxy group is even more preferable.

Examples of the monovalent organic group represented by $R^2$ include a linear, branched, or cyclic alkyl group having 1 to 20 carbon atoms and an aryl group having 6 to 20 carbon atoms which may have a substituent. Among these, a linear or branched alkyl group having 1 to 20 carbon atoms is preferable, and a branched alkyl group having 1 to 10 carbon atoms is more preferable.

a is preferably 1, and $R^1$ is preferably at the para position.

Examples of the substituent that the aryl group may have include an alkoxy group, a hydroxy group, a carboxy group, and an amino group.

Specific examples of the compound represented by Formula (B1) include octyl cinnamate, ethyl-4-isopropyl cinnamate, ethyl-2,4-diisopropyl cinnamate, methyl-2,4-diisopropyl cinnamate, propyl-p-methoxycinnamate, isopropyl-p-methoxycinnamate, isoamyl-p-methoxycinnamate, 2-ethylhexyl-p-methoxycinnamate, 2-ethoxyethyl-p-methoxycinnamate, 2-hexyldecanyl-p-methoxycinnamate, and cyclohexyl-p-methoxycinnamate.

In the photo alignment film forming composition, the content of the low-molecular-weight compound B is preferably 10 to 500 mass %, and more preferably 30 to 300 mass % with respect to the mass of the repeating unit a1 of the polymer Ap since the alignment property of a photo alignment film to be produced is improved.

In a case where the photo alignment film forming composition contains an organic solvent to be described later, the content of the low-molecular-weight compound B is preferably 0.01 to 50 parts by mass, and more preferably 0.1 to 10 parts by mass with respect to 100 parts by mass of the solvent.

(Crosslinking Agent C)

Since the adhesiveness with the polymer support and the alignment restriction force are improved, the photo alignment film forming composition preferably contains a crosslinking agent C having a crosslinkable group which can react with the polymer Ap, separately from the polymer Ap containing the crosslinkable group-containing repeating unit a1. By appropriately adjusting the amount of the crosslinkable group, extraction of the component derived from the additive of the polymer support and diffusion in the coating film can be controlled.

The molecular weight of the crosslinking agent C is preferably 1,000 or less, and more preferably 100 to 500.

The crosslinkable group is preferably a thermally crosslinkable group which causes a curing reaction by the action of heat.

Examples of the crosslinking agent C include a compound having two or more epoxy groups or oxetanyl groups in the molecule, a blocked isocyanate compound (a compound having a protected isocyanato group), and an alkoxymethyl group-containing compound.

Among these, a compound having two or more epoxy groups or oxetanyl groups in the molecule, or a blocked isocyanate compound is preferable.

«Compound Having Two or More Epoxy Groups in Molecule»

Specific examples of the compound having two or more epoxy groups in the molecule include aliphatic epoxy compounds.

These are commercially available. Examples thereof include DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC- 204, DLC-205, DLC-206, DLC-301, and DLC-402 (all manufactured by Nagase ChemteX Corporation), CELLOXIDE 2021P, 2081, 3000, and EHPE3150, EPOLEAD GT401, and CELVENUS B0134 and B0177 (manufactured by Daicel Corporation).

The compounds having two or more epoxy groups in the molecule may be used alone or in combination of two or more kinds thereof.

«Compound Having Two or More Oxetanyl Groups in Molecule»

Specific examples of the compound having two or more oxetanyl groups in the molecule include ARON OXETANE OXT-121, OXT-221, OX-SQ, and PNOX (all manufactured by Toagosei Co., Ltd.).

«Blocked Isocyanate Compound»

The blocked isocyanate compound is not particularly limited as long as it is a compound having a blocked isocyanate group in which an isocyanate group is chemically protected, and from the viewpoint of curability, it is preferably a compound having two or more blocked isocyanate groups in one molecule.

In the present invention, the blocked isocyanate group is a group capable of generating an isocyanate group by heat, and preferable examples thereof include a group in which an isocyanate group is protected by reacting a blocking agent with the isocyanate group. The blocked isocyanate group is preferably a group capable of generating an isocyanate group by heat at 90° C. to 250° C.

The skeleton of the blocked isocyanate compound is not particularly limited. The blocked isocyanate compound may be any compound as long as it has two isocyanate groups in one molecule, and may be an aliphatic, alicyclic, or aromatic polyisocyanate, and for example, isocyanate compounds such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane-4,4'-diisocyanate, o-xylene diisocyanate, m-xylene diisocyanate, p-xylene diisocyanate, methylenebis (cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methylene ditolylene-4,4'-diisocyanate, 4,4'-diphenyl ether diisocyanate, tetrachlorophenylene diisocyanate, norbornane diisocyanate, hydrogenated 1,3-xylylene diisocyanate, and hydrogenated 1,4-xylylene diisocyanate, and compounds with a prepolymer type skeleton, derived from the compounds, can be preferably used. Among these, tolylene diisocyanate (TDI), diphenylmethane diisocyanate (MDI), hexamethylene diisocyanate (HDI), or isophorone diisocyanate (IPDI) is preferable.

Examples of the mother structure of the blocked isocyanate compound include a biuret type, an isocyanurate type, an adduct type, and a bifunctional prepolymer type.

Examples of the blocking agent which forms the blocked structure of the blocked isocyanate compound include an oxime compound, a lactam compound, a phenol compound, an alcohol compound, an amine compound, an active methylene compound, a pyrazole compound, a mercaptan compound, an imidazole-based compound, and an imide-based compound. Among these, a blocking agent selected from an oxime compound, a lactam compound, a phenol compound, an alcohol compound, an amine compound, an active methylene compound, and a pyrazole compound is preferable.

The blocked isocyanate compound is commercially available, and examples thereof include CORONATE AP STABLE M, CORONATE 2503, 2515, 2507, 2513, and 2555, and MILLIONATE MS-50 (all manufactured by Nippon Polyurethane Industry Co., Ltd.), TAKENATE B-830, B-815N, B-820NSU, B-842N, B-846N, B-870N, B-874N, and B-882N (all manufactured by Mitsui Chemicals, Inc.), DURANATE 17B-60PX, 17B-60P, TPA-B80X, TPA-B80E, MF-B60X, MF-B60B, MF-K60X, MF-K60B, E402-B80B, SBN-70D, SBB-70P, and K6000 (all manufactured by Asahi Kasei Chemicals Corp.), DESMODUR BL1100, BL1265 MPA/X, BL3575/1, BL3272MPA, BL3370MPA, BL3475BA/SN, BL5375MPA, VPLS2078/2, BL4265SN, PL340, and PL350, and SUMIDUR BL3175 (all manufactured by Sumika Bayer Urethane Co., Ltd.).

In a case where the photo alignment film forming composition contains the crosslinking agent C, the content of the crosslinking agent C is preferably 1 to 1,000 parts by mass, and more preferably 10 to 500 parts by mass with respect to 100 parts by mass of the repeating unit a1 of the polymer Ap. In a case where the photo alignment film forming composition contains an organic solvent to be described later, the content of the crosslinking agent C is preferably 0.05 to 50 parts by mass, and more preferably 1 to 10 parts by mass with respect to 100 parts by mass of the solvent.

(Other Components D)

The photo alignment film forming composition may contain a component other than the above components.

Examples of other components include a crosslinking accelerator, an adhesion improver, a leveling agent, and a plasticizer. Examples of the crosslinking accelerator include various metal salt chelate compounds and a thermal acid generator. As the adhesion improver, the leveling agent, and the plasticizer, various known materials known as additives for a coating composition can be used.

(Organic Solvent)

The photo alignment film forming composition preferably contains an organic solvent from the viewpoint of workability for producing a photo alignment film. By appropriately selecting the solvent, it acts on the surface of the polymer support in the application of the photo alignment film forming composition to the polymer support, and adhesiveness with the photo alignment film is strengthened. In addition, extraction of the component derived from the additive of the polymer support is controlled, and thus control of the alignment of the optically anisotropic film can be improved.

The organic solvent is preferably an organic solvent easily compatible with the component derived from the additive of the polymer support. In a case where an organic solvent easily compatible with the component derived from the additive of the polymer support is used in the photo alignment film forming composition, it acts on the surface of the polymer support in the application of the photo alignment film forming composition to the polymer support, and adhesiveness with the photo alignment film can be strengthened. Furthermore, by appropriately adjusting the content of the organic solvent, excessive extraction of the component derived from the additive of the polymer support to the photo alignment film forming composition is suppressed, and thus control of the alignment of the optically anisotropic film can be improved.

In a case where the polymer support is a cellulose acylate film containing an additive, and the additive is a polyester compound or a sugar ester compound, ketones, esters, or propylene glycol ethers are preferably contained as the organic solvent.

Specific examples of the organic solvent include ketones (for example, acetone, 2-butanone, methyl isobutyl ketone, methyl ethyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, propylene glycol ethers (for example, propylene glycol monomethyl ether), sulfoxides (for example, dimethyl sulfoxide), and amides (for example, dimethylformamide and dimethylacetamide).

The organic solvents may be used alone or in combination of two or more kinds thereof.

[Method of Manufacturing Photo Alignment Film]

The photo alignment film constituting the present invention can be manufactured by a manufacturing method which has been known, except that the photo alignment film forming composition described above is used. Particularly, the photo alignment film is preferably manufactured by a roll-to-roll process.

Specific examples of the manufacturing method include a manufacturing method including the following step 1, the following step 2, and the following step 3. By appropriately adjusting the conditions of the steps, the adhesiveness between the polymer support and the photo alignment film is increased, and extraction of the component derived from the additive of the polymer support is controlled, whereby control of alignment of the optically anisotropic film can be improved.

Step 1: A coating step of applying the above-described photo alignment film forming composition to the surface of the above-described polymer support to form a coating film Step 2: A heating step of drying and crosslinking the coating film by heating Step 3: A light irradiation step of applying polarized light to the coating film after the drying and crosslinking, or applying unpolarized light to a surface of the coating film after the drying and crosslinking from an oblique direction Hereinafter, the manufacturing method will be described with reference to FIG. 3.

<Step 1: Coating Step>

The coating method in the coating step is not particularly limited, and can be appropriately selected according to the purpose. Examples thereof include spin coating, die coating, gravure coating, flexographic printing, and inkjet printing. Die coating or gravure coating is preferable in a roll-to-roll process.

Figure 3:
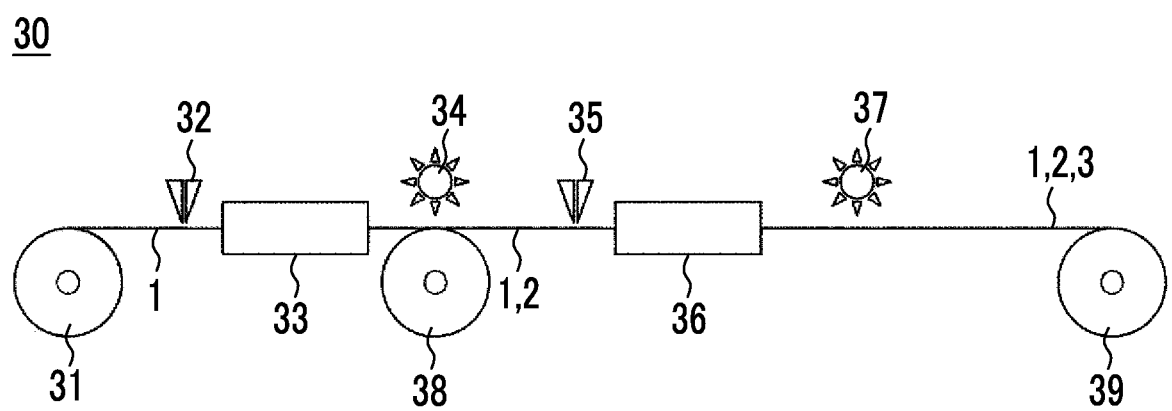
FIG. 3 is a conceptual diagram showing an example of a manufacturing method of manufacturing the optical film according to the embodiment of the present invention by a roll-to-roll process.

In FIG. 3, coating is performed using a die 32 on a polymer support 1 unwound from a wound body (roll) of the polymer support.

<Step 2: Heating Step>

The heating method in the heating step is not particularly limited, and the coated polymer support obtained through the step 1 may be heated by a known method.

Examples of the heating method include a method of heating the coated polymer support by exposure to a heating atmosphere, a method of heating the coated polymer support by contact with a transport roll or the like with a heating medium flowing therein, and a method of heating the coated polymer support by irradiation with heat rays. The heating temperature is preferably 30° C. to 200° C.

By appropriately controlling the removal of the solvent in the coating film and the thermal crosslinking reaction of the polymer Ap during the heating step, the adhesiveness between the polymer support and the photo alignment film is strengthened, and extraction of the component derived from the additive of the polymer support is controlled, whereby control of the alignment of the optically anisotropic film can be improved.

In FIG. 3, the coated polymer support is heated by a heating device 33.

<Light Irradiation Step>

In the light irradiation step, the polarized light which is applied to the coating film after the drying and crosslinking subjected to the step 2 is not particularly limited, and examples thereof include linearly polarized light, circularly polarized light, and elliptically polarized light. Linearly polarized light is preferable.

The "oblique direction" from which the unpolarized light is applied is not particularly limited as long as it is a direction inclined at a polar angle θ (0<θ<90°) with respect to the normal direction of the coating film surface, and can be appropriately selected according to the purpose.

The wavelength of polarized light or unpolarized light is not particularly limited as long as it is a wavelength at which the alignment of liquid crystal molecules contained in the coating film after the drying and crosslinking can be controlled, and examples thereof include ultraviolet rays, near-ultraviolet rays, and visible rays. Among these, near-ultraviolet rays of 250 nm to 450 nm are particularly preferable. In addition, examples of the light source for applying polarized light or unpolarized light include a xenon lamp, a high-pressure mercury lamp, an ultrahigh-pressure mercury lamp, and a metal halide lamp. By applying an interference filter, a color filter, or the like to ultraviolet rays and visible rays obtained from the light sources, the wavelength range for irradiation can be appropriately controlled. In addition, by applying a polarization filter and a polarization prism to the light from the light sources, linearly polarized light can be obtained.

In a case where a light source such as light emitting diode (LED) or laser is used, the same polarized light irradiation can be realized with a simpler configuration.

The integrated light quantity of polarized light or unpolarized light is not particularly limited at a wavelength at which the alignment of liquid crystal molecules contained in the coating film after the drying and crosslinking can be controlled, and is preferably 1 to 600 mJ/cm$^2$, more preferably 1 to 300 mJ/cm$^2$, and even more preferably 5 to 100 mJ/cm$^2$.

The illuminance of polarized light or unpolarized light is not particularly limited at a wavelength at which the alignment of liquid crystal molecules contained in the coating film after the drying and crosslinking can be controlled, and is preferably 0.1 to 300 mW/cm$^2$, and more preferably 1 to 100 mW/cm$^2$.

As shown in FIG. 3, a backup roll 38 for preventing the polymer support 1 from oscillating with respect to the light source is preferably provided in view of the fact that unevenness or variation is not caused in the alignment of liquid crystal molecules contained in the coating film in the light irradiation performed on the coating film after the drying and crosslinking subjected to the step 2.

[Optically Anisotropic Film]

The optically anisotropic film of the optical film according to the embodiment of the present invention is a layer obtained by curing a composition containing a polymerizable liquid crystal compound having reverse wavelength dispersibility (hereinafter, also referred to as "polymerizable liquid crystal composition").

In the optically anisotropic film, the alignment state of the liquid crystal compound is fixed. That is, in the optically anisotropic film, the liquid crystal compound forms an alignment state with an alignment restriction force of the photo alignment film described above, and the alignment state is fixed by polymerization of the polymerizable group in the liquid crystal compound through a curing treatment.

The term "polymerizable liquid crystal compound having reverse wavelength dispersibility" means a polymerizable liquid crystal compound capable of forming an optically anisotropic film having reverse wavelength dispersibility.

As the polymerizable liquid crystal compound, a specific polymerizable liquid crystal compound to be described later is preferable.

The thickness of the optically anisotropic film is not particularly limited, and is preferably 0.1 to 10 μm, and more preferably 0.5 to 5 μm.

In a case where the optically anisotropic film functions as a positive A plate, it is preferably an optically anisotropic film in which a specific polymerizable liquid crystal compound is homogeneously (horizontally) aligned.

Furthermore, since the alignment property of the optically anisotropic film is improved, the optically anisotropic film is preferably a layer obtained by polymerizing the polymerizable liquid crystal composition (fixing the alignment state) after alignment in a smectic phase.

The optically anisotropic film of the optical film according to the embodiment of the present invention preferably has reverse wavelength dispersibility and satisfies Formula (II) from the viewpoint of exhibiting a uniform polarization conversion function over a wide band and imparting excellent display performance to a display device.

$$0.75 < Re(450)/Re(550) < 1.00 \quad (II)$$

Here, in Formula (II), Re (450) represents in-plane retardation of the optically anisotropic film at a wavelength of 450 nm, and Re (550) represents in-plane retardation of the optically anisotropic film at a wavelength of 550 nm.

As described above, the value of the in-plane retardation refers to a value measured using AxoScan OPMF-1 (manufactured by OPTO SCIENCE, INC.) with the use of light at a measurement wavelength.

Formula (II) can be achieved by using a specific polymerizable liquid crystal compound to be described later in the polymerizable liquid crystal composition. Hereinafter, the specific polymerizable liquid crystal compound contained in the polymerizable liquid crystal composition and optional additives will be described below.

<Specific Polymerizable Liquid Crystal Compound>

In this specification, the specific polymerizable liquid crystal compound is a polymerizable liquid crystal compound represented by Formula (1). The polymerizable liquid crystal compound represented by Formula (1) has reverse wavelength dispersibility. That is, in a case where the polymerizable liquid crystal compound represented by formula (1) is cured to form an optically anisotropic film, the optically anisotropic film exhibits reverse wavelength dispersibility.

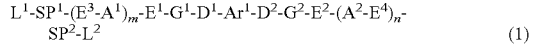

(1)

In Formula (1), $D^1$, $D^2$, $E^1$, $E^2$, $E^3$, and $E^4$ each independently represent a single bond, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—. In Formula (1), the bonding direction of the divalent group represented by $D^1$, $D^2$, $E^1$, $E^2$, $E^3$, and $E^4$ (for example, —CO—O—) is not limited unless otherwise specified. For example, in a case where $D^1$ is —CO—O—, the connection form between $D^1$ and $G^1$ and Ar$^1$ adjacent thereto may be $G^1$-CO—O—Ar$^1$ or $G^1$-O—CO—Ar$^1$. $R^1$, $R^2$, $R^3$, and $R^4$ each independently represent a hydrogen atom, a fluorine atom, or an alkyl group having 1 to 4 carbon atoms.

In Formula (1), $G^1$ and $G^2$ each independently represent a divalent alicyclic hydrocarbon group having 5 to 8 carbon atoms which may have a substituent, and one or more —CH$_2$—'s of the alicyclic hydrocarbon group may be substituted with —O—, —S—, or NH—.

In Formula (1), $A^1$ and $A^2$ each independently represent a divalent aromatic hydrocarbon group having 6 to 12 carbon atoms which may have a substituent, or a divalent alicyclic hydrocarbon group having 5 to 8 carbon atoms which may have a substituent, and one or more —CH$_2$—'s of the alicyclic hydrocarbon group may be substituted with —O—, —S—, or NH—.

In Formula (1), SP$^1$ and SP$^2$ each independently represent a single bond, a linear or branched alkylene group having 1 to 12 carbon atoms, or a divalent linking group in which one or more —CH$_2$—'s of a linear or branched alkylene group having 1 to 12 carbon atoms are substituted with —O—, —S—, —NH—, —N(Q)-, or —CO—, and Q represents a substituent.

In Formula (1), $L^1$ and $L^2$ each independently represent a monovalent organic group, and at least one of $L^1$ or $L^2$ represents a polymerizable group. In a case where Ar$^1$ is an aromatic ring represented by Formula (Ar-3), at least one of $L^1$ or $L^2$, or $L^3$ or $L^4$ in Formula (Ar-3) represents a polymerizable group.

In Formula (1), m represents an integer of 0 to 2. In a case where m is 2, a plurality of $E^3$'s may be the same or different from each other, and a plurality of $A^1$'s may be the same or different from each other.

In Formula (1), n represents an integer of 0 to 2. In a case where n is 2, a plurality of $E^4$'s may be the same or different from each other, and a plurality of $A^2$'s may be the same or different from each other.

In Formula (1), Ar$^1$ represents any aromatic ring selected from the group consisting of groups represented by Formulae (Ar-1) to (Ar-5) to be described later.

In Formula (1), the alkyl group having 1 to 4 carbon atoms represented by $R^1$, $R^2$, $R^3$, and $R^4$ may be linear, branched, or cyclic. Specific examples thereof include a methyl group, an ethyl group, a propyl group, an isopropyl group, an n-butyl group, an isobutyl group, a sec-butyl group, and a tert-butyl group.

In Formula (1), the divalent alicyclic hydrocarbon group having 5 to 8 carbon atoms represented by $G^1$ and $G^2$ is preferably a 5-membered ring or a 6-membered ring. The alicyclic hydrocarbon group may be saturated or unsaturated, and is preferably a saturated alicyclic hydrocarbon group. Regarding the divalent alicyclic hydrocarbon group represented by $G^1$ and $G^2$, for example, the description in paragraph [0078] of JP2012-021068A can be referred to, and the contents thereof are incorporated herein.

Among these, a cyclohexylene group (a divalent group derived from a cyclohexane ring) is preferable, a 1,4-cyclohexylene group is more preferable, and a trans-1,4-cyclohexylene group is even more preferable.

Examples of the substituent that the divalent alicyclic hydrocarbon group having 5 to 8 carbon atoms represented by $G^1$ and $G^2$ in Formula (1) may have include the same substituents as those that the aromatic hydrocarbon group having 6 to 12 carbon atoms or the aromatic heterocyclic group having 3 to 12 carbon atoms represented by $Y^1$ in Formula (Ar-1) to be described later may have.

Examples of the divalent aromatic hydrocarbon group having 6 to 12 carbon atoms represented by $A^1$ and $A^2$ in Formula (1) include a 1,2-phenylene group, a 1,3-phenylene group, a 1,4-phenylene group, a 1,4-naphthylene group, a 1,5-naphthylene group, and a 2,6-naphthylene group. Among these, a 1,4-phenylene group is preferable, and a trans-1,4-phenylene group is more preferable.

Examples of the divalent alicyclic hydrocarbon group having 5 to 8 carbon atoms represented by $A^1$ and $A^2$ include those described above for $G^1$ and $G^2$ in Formula (1). A cyclohexylene group (a divalent group derived from a cyclohexane ring) is preferable, a 1,4-cyclohexylene group is more preferable, and a trans-1,4-cyclohexylene group is even more preferable.

Examples of the substituent that the divalent aromatic hydrocarbon group having 6 to 12 carbon atoms represented by $A^1$ and $A^2$ or the divalent alicyclic hydrocarbon group having 5 to 8 carbon atoms represented by $A^1$ and $A^2$ in Formula (1) may have include the same substituents as those that the aromatic hydrocarbon group having 6 to 12 carbon atoms or the aromatic heterocyclic group having 3 to 12 carbon atoms represented by $Y^1$ in Formula (Ar-1) to be described later may have.

As the linear or branched alkylene group having 1 to 12 carbon atoms represented by $SP^1$ and $SP^2$ in Formula (1), for example, a methylene group, an ethylene group, a propylene group, a butylene group, a pentylene group, a hexylene group, a methylhexylene group, or a heptylene group is preferable. As described above, $SP^1$ and $SP^2$ may be a divalent linking group in which one or more —$CH_2$—'s of a linear or branched alkylene group having 1 to 12 carbon atoms are substituted with —O—, —S—, —NH—, —N(Q)-, or —CO—. Examples of the substituent represented by Q include the same substituents as those that the aromatic hydrocarbon group having 6 to 12 carbon atoms or the aromatic heterocyclic group having 3 to 12 carbon atoms represented by $Y^1$ in Formula (Ar-1) to be described later may have.

Examples of the monovalent organic group represented by $L^1$ and $L^2$ in Formula (1) include an alkyl group, an aryl group, a heteroaryl group, and a cyano group.

The alkyl group may be linear, branched, or cyclic, and is preferably linear. The number of carbon atoms of the alkyl group is preferably 1 to 30, more preferably 1 to 20, and even more preferably 1 to 10.

The aryl group may be monocyclic or polycyclic, and is preferably a monocyclic. The number of carbon atoms of the aryl group is preferably 6 to 25, and more preferably 6 to 10.

The heteroaryl group may be monocyclic or polycyclic. The number of hetero atoms of the heteroaryl group is preferably 1 to 3. The hetero atom of the heteroaryl group is preferably a nitrogen atom, a sulfur atom, or an oxygen atom. The number of carbon atoms of the heteroaryl group is preferably 6 to 18, and more preferably 6 to 12.

The alkyl group, the aryl group, and the heteroaryl group described above may be unsubstituted or may have a substituent. Examples of the substituent include the same substituents as those that the aromatic hydrocarbon group having 6 to 12 carbon atoms or the aromatic heterocyclic group having 3 to 12 carbon atoms represented by $Y^1$ in Formula (Ar-1) to be described later may have.

In Formula (1), the polymerizable group represented by at least one of $L^1$ or $L^2$ is not particularly limited, and is preferably a polymerizable group (radically polymerizable group) capable of being radically polymerized, or a polymerizable group (cationically polymerizable group) capable of being cationically polymerized.

As the radically polymerizable group, a generally known radically polymerizable group can be used, and an acryloyl group or a methacryloyl group is preferable. In comparison of an acryloyl group with a methacryloyl group, it has been generally known that the polymerization rate of the acryloyl group is higher, and an acryloyl group is preferable from the viewpoint of improving productivity. However, a methacryloyl group can also be used as a polymerizable group.

As the cationically polymerizable group, a generally known cationically polymerizable group can be used, and specific examples thereof include an alicyclic ether group, a cyclic acetal group, a cyclic lactone group, a cyclic thioether group, a spiro ortho ester group, and a vinyloxy group. Among these, an alicyclic ether group or a vinyloxy group is preferable, and an epoxy group, an oxetanyl group, or a vinyloxy group is more preferable.

As the polymerizable group, those exemplified as below are preferable.

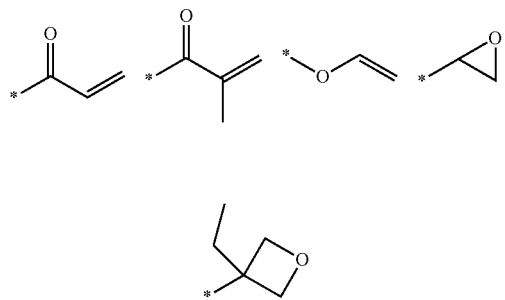

In Formula (1), both $L^1$ and $L^2$ in Formula (1) are preferably a polymerizable group, and more preferably an acryloyl group or a methacryloyl group since moisture-heat resistance is improved.

In Formula (1), $Ar^1$ represents an aromatic ring of any one selected from the group consisting of groups represented by Formulae (Ar-1) to (Ar-5). In Formulae (Ar-1) to (Ar-5), * represents a bonding position with $D^1$ or $D^2$ in Formula (I).

Hereinafter, Formulae (Ar-1) to (Ar-5) will be described.

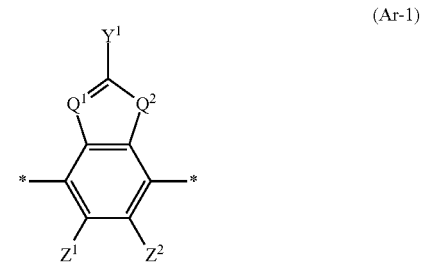

(Ar-1)

-continued

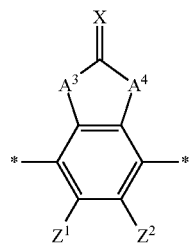
(Ar-2)

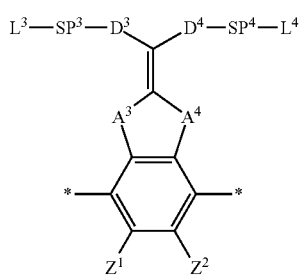
(Ar-3)

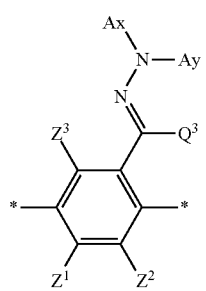
(Ar-4)

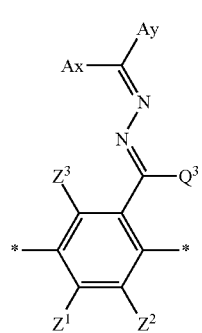
(Ar-5)

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, $Y^1$ represents an aromatic hydrocarbon group having 6 to 12 carbon atoms which may have a substituent, or an aromatic heterocyclic group having 3 to 12 carbon atoms which may have a substituent.

Specific examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, and a pyridyl group.

Examples of the substituent that the aromatic hydrocarbon group having 6 to 12 carbon atoms or the aromatic heterocyclic group having 3 to 12 carbon atoms represented by $Y^1$ may have include an alkyl group, an alkoxy group, and a halogen atom.

The alkyl group is, for example, preferably a linear, branched, or cyclic alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group), even more preferably an alkyl group having 1 to 4 carbon atoms, and particularly preferably a methyl group or an ethyl group.

The alkoxy group is, for example, preferably an alkoxy group having 1 to 18 carbon atoms, more preferably an alkoxy group having 1 to 8 carbon atoms (for example, a methoxy group, an ethoxy group, an n-butoxy group, and a methoxyethoxy group), even more preferably an alkoxy group having 1 to 4 carbon atoms, and particularly preferably a methoxy group or an ethoxy group.

Examples of the halogen atom include a fluorine atom, a chlorine atom, a bromine atom, and an iodine atom, and among these, a fluorine atom or a chlorine atom is preferable.

In Formulae (Ar-1) to (Ar-5), $Z^1$, $Z^2$, and $Z^3$ each independently represent a hydrogen atom, a monovalent linear or branched aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, —$SR^9$, —$COOR^X$, or —$OCOR^Y$, $R^6$ to $R^9$, $R^X$, and $R^Y$ each independently represent a hydrogen atom or an alkyl group having 1 to 6 carbon atoms, and $Z^1$ and $Z^2$ may be bonded to each other to form an aromatic ring.

The monovalent linear or branched aliphatic hydrocarbon group having 1 to 20 carbon atoms is preferably an alkyl group having 1 to 15 carbon atoms, and more preferably an alkyl group having 1 to 8 carbon atoms. Specifically, a methyl group (Me), an ethyl group, an isopropyl group, a tert-pentyl group (1,1-dimethylpropyl group), a tert-butyl group (tBu), or a 1,1-dimethyl-3,3-dimethyl-butyl group is more preferable, and a methyl group, an ethyl group, or a tert-butyl group is even more preferable.

Examples of the monovalent alicyclic hydrocarbon group having 3 to 20 carbon atoms include monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and cyclodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group. An aryl group (particularly, a phenyl group) having 6 to 12 carbon atoms is preferable.

Examples of the halogen atom include a fluorine atom, a chlorine atom, a bromine atom, and an iodine atom, and among these, a fluorine atom, a chlorine atom, or a bromine atom is preferable.

Specific examples of the alkyl group having 1 to 6 carbon atoms represented by $R^6$ to $R^9$, $R^X$, and $R^Y$ include a methyl group, an ethyl group, a propyl group, an isopropyl group, an n-butyl group, an isobutyl group, a sec-butyl group, a tert-butyl group, an n-pentyl group, and an n-hexyl group.

In Formulae (Ar-2) and (Ar-3), $A^3$ and $A^4$ each independently represent a group selected from the group consisting of —O—, —N($R^{10}$)—, —S—, and —CO—. $R^{10}$ represents a hydrogen atom or a substituent. Examples of the substituent include the same substituents as those that the aromatic hydrocarbon group having 6 to 12 carbon atoms or the aromatic heterocyclic group having 3 to 12 carbon atoms represented by $Y^1$ in Formula (Ar-1) may have.

In Formula (Ar-2), X represents a hydrogen atom or a non-metal atom of Group 14, 15, or 16 to which a substituent may be bonded.

Examples of the non-metal atom of Group 14, 15, or 16 represented by X include an oxygen atom, a sulfur atom, a nitrogen atom having a substituent, and a carbon atom having a substituent. Specific examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In Formula (Ar-3), $D^3$ and $D^4$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. In Formula (Ar-3), the bonding direction of the divalent group (for example, —CO—O—) represented by $D^3$ and $D^4$ is not limited unless otherwise specified. For example, in a case where $D^3$ is —CO—O—, the connection form between $D^1$ and $SP^3$ and a carbon atom adjacent thereto may be $SP^3$—CO—O-carbon atom, or $SP^3$—O—CO-carbon atom. $R^1$, $R^2$, $R^3$, and $R^4$ each independently represent a hydrogen atom, a fluorine atom, or an alkyl group having 1 to 4 carbon atoms.

In Formula (1), the alkyl group having 1 to 4 carbon atoms represented by $R^1$, $R^2$, $R^3$, and $R^4$ may be linear, branched, or cyclic. Specific examples thereof include a methyl group, an ethyl group, a propyl group, an isopropyl group, an n-butyl group, an isobutyl group, a sec-butyl group, and a tert-butyl group.

In Formula (Ar-3), $SP^3$ and $SP^4$ each independently represent a single bond, a linear or branched alkylene group having 1 to 12 carbon atoms, or a divalent linking group in which one or more —$CH_2$—'s of a linear or branched alkylene group having 1 to 12 carbon atoms are substituted with —O—, —S—, —NH—, —N(Q)-, or —CO—, and Q represents a substituent.

Examples of the linear or branched alkylene group having 1 to 12 carbon atoms include those described above for $SP^1$ and $SP^2$ in Formula (1).

Examples of the substituent represented by Q include the same substituents as those that the aromatic hydrocarbon group having 6 to 12 carbon atoms or the aromatic heterocyclic group having 3 to 12 carbon atoms represented by $Y^1$ in Formula (Ar-1) may have.

In Formula (Ar-3), $L^3$ and $L^4$ each independently represent a monovalent organic group, and at least one of $L^3$ or $L^4$, or $L^1$ or $L^2$ in Formula (1) represents a polymerizable group.

Examples of the monovalent organic group include those described above for $L^1$ and $L^2$ in Formula (1).

Examples of the polymerizable group include those described above for $L^1$ and $L^2$ in Formula (1).

In Formulae (Ar-4) and (Ar-5), Ax represents an organic group having 2 to 30 carbon atoms, which has at least one aromatic ring selected from the group consisting of an aromatic hydrocarbon ring and an aromatic heterocyclic ring.

In Formulae (Ar-4) and (Ar-5), Ay represents a hydrogen atom, an alkyl group having 1 to 12 carbon atoms which may have a substituent, or an organic group having 2 to 30 carbon atoms, which has at least one aromatic ring selected from the group consisting of an aromatic hydrocarbon ring and an aromatic heterocyclic ring.

Here, the aromatic ring in Ax and Ay may have a substituent, and Ax and Ay may be bonded to each other to form a ring.

In addition, in Formulae (Ar-4) and (Ar-5), $Q^3$ represents a hydrogen atom or an alkyl group having 1 to 6 carbon atoms which may have a substituent.

Examples of Ax and Ay include those described in paragraphs [0039] to [0095] of (WO2014/010325A).

Specific examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group. Examples of the substituent that the alkyl group having 1 to 6 carbon atoms represented by $Q^3$ may have include the same substituents as those that the aromatic hydrocarbon group having 6 to 12 carbon atoms or the aromatic heterocyclic group having 3 to 12 carbon atoms represented by $Y^1$ in Formula (Ar-1) may have.

The polymerizable liquid crystal compound is preferably a compound in which in Formula (1), m is 1, both $A^1$ and $G^1$ are a cyclohexylene group which may have a substituent, $E^1$ is a single bond, n is 1, both $A^2$ and $G^2$ are a cyclohexylene group which may have a substituent, and $E^2$ is a single bond since the moisture-heat resistance of the optically anisotropic film is improved.

In addition, since light resistance is improved, the pKa of a diphenol compound represented by HO—$Ar^1$—OH derived from the structure of $Ar^1$ in Formula (1) is preferably 11 or less.

Here, the pKa is a value of an acid dissociation constant in a mixed solvent having a volume ratio of tetrahydrofuran (THF)/water=6/4 at 25° C.

As a method of measuring the acid dissociation constant in the present invention, the alkali titration method described on pages 215 to 217 of Experimental Chemistry Lecture, 2nd edition, published by Maruzen Co., Ltd. can be used.

Preferable examples of the polymerizable liquid crystal compound (1) include compounds represented by Formulae (1-1) to (1-14). Specific examples thereof include compounds having a side chain structure shown in the following Table 1 as K (side chain structure) in Formulae (1-1) to (1-14).

In the following Table 1, "*" shown in the side chain structure of K represents a bonding position with the aromatic ring.

In the side chain structure represented by 1-2 and in the side chain structure represented by 1-12 in the following Table 1, the group adjacent to the acryloyloxy group and the group adjacent to the methacryloyl group represent a propylene group (a group in which a methyl group is substituted with an ethylene group), and the compound represented by 1-2 and the compound represented by 1-12 represent a mixture of regioisomers with different methyl group positions.
(1-1)
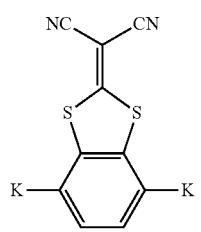
(1-2)
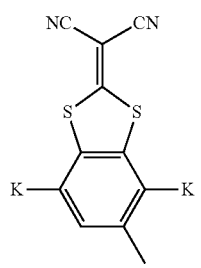
(1-3)
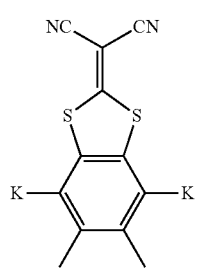
(1-4)
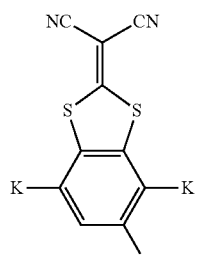
(1-5)
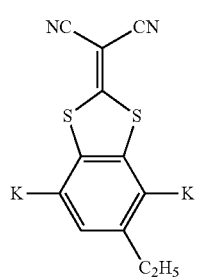
-continued
(1-6)
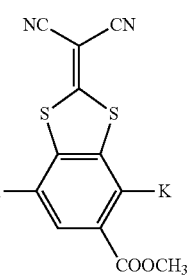
(1-7)
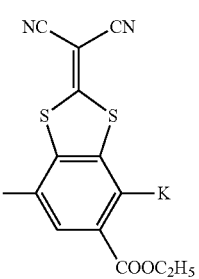
(1-8)
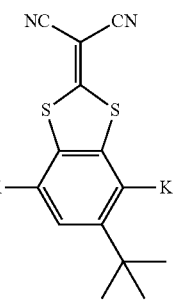
(1-9)
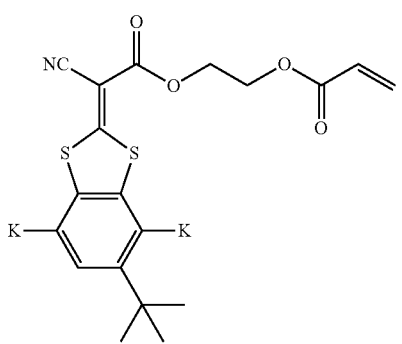
(1-10)
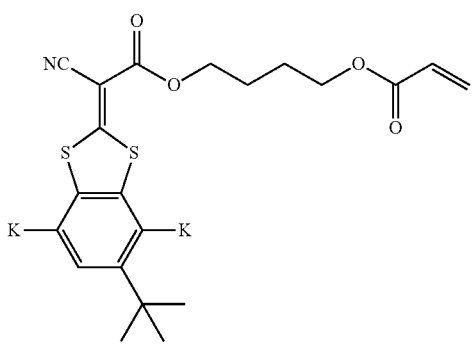

-continued
(1-11)
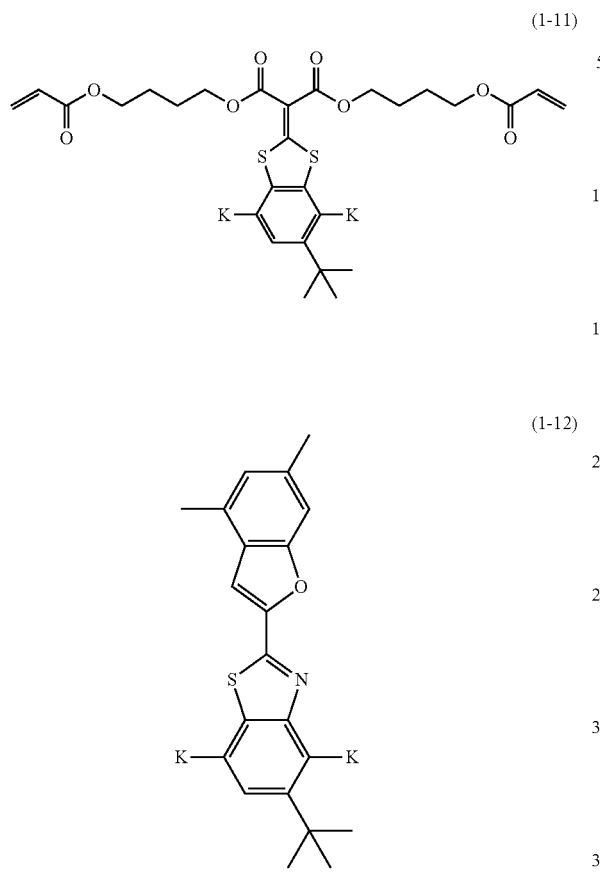
(1-12)
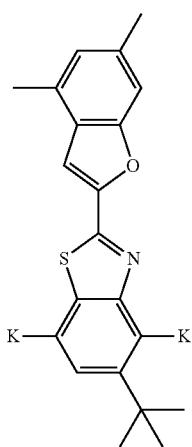
-continued
(1-13)
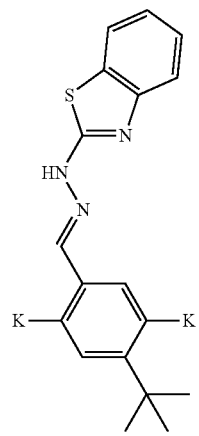
(1-14)
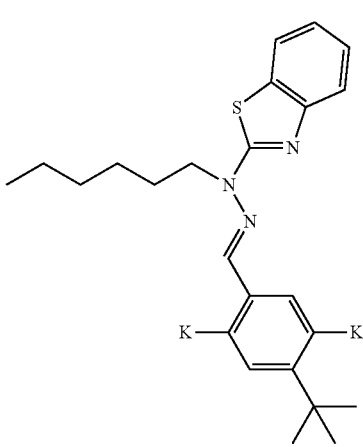
TABLE 1
| | K (side chain structure) |
|---|---|
| 1-1 | 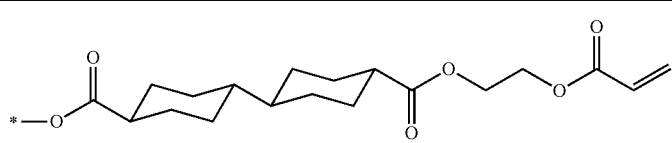 |
| 1-2 | 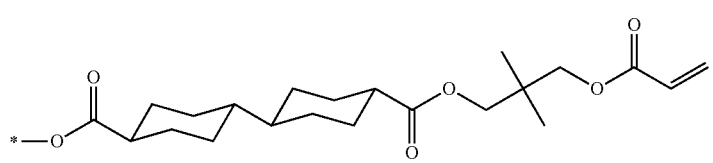 |
| 1-3 | 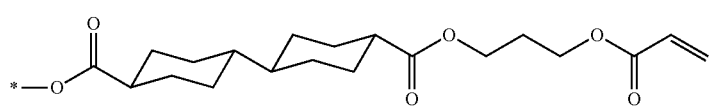 |
| 1-4 | 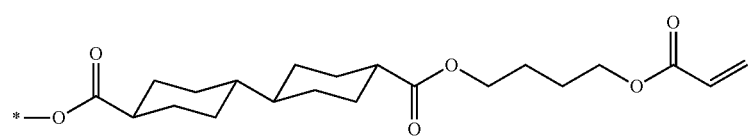 |

TABLE 1-continued

| | K (side chain structure) |
|---|---|
| 1-5 | |
| 1-6 | |
| 1-7 | |
| 1-8 | |
| 1-9 | |
| 1-10 | |
| 1-11 | |
| 1-12 | |

<Other Polymerizable Compounds>

The polymerizable liquid crystal composition may contain other polymerizable compounds having one or more polymerizable groups, as well as the specific polymerizable liquid crystal compound described above.

Here, the polymerizable group of other polymerizable compounds is not particularly limited, and examples thereof include a (meth)acryloyl group, a vinyl group, a styryl group, and an allyl group. Among these, a (meth)acryloyl group is preferable as the polymerizable group.

Other polymerizable compounds preferably have 1 to 4 polymerizable groups, and more preferably 2 to 4 polymerizable groups since durability of the optically anisotropic film to be formed is improved.

Examples of other polymerizable compounds include compounds represented by Formulae (M1), (M2), and (M3) described in paragraphs [0030] to [0033] of JP2014-077068A. Specific examples thereof include those described in paragraphs [0046] to [0055] of JP2014-077068A.

A known polymerizable liquid crystal compound may be added to adjust wavelength dispersibility and the magnitude of refractive index anisotropy, and to adjust the liquid crystal phase transition temperature of the coating film. Examples of the polymerizable liquid crystal compound include various polymerizable liquid crystal compounds described in "LIQUID CRYSTAL HANDBOOK" (edited by Liquid Crystal Handbook Editing Committee, Maruzen Co., Ltd.).

<Polymerization Initiator>

The polymerizable liquid crystal composition preferably contains a polymerization initiator.

The polymerization initiator is preferably a photopolymerization initiator capable of initiating a polymerization reaction by ultraviolet irradiation.

Examples of the photopolymerization initiator include α-carbonyl compounds (described in U.S. Pat. Nos. 2,367,661A and 2,367,670A), acyloin ethers (described in U.S. Pat. No. 2,448,828A), α-hydrocarbon-substituted aromatic acyloin compounds (described in U.S. Pat. No. 2,722,512A), polynuclear quinone compounds (described in U.S. Pat. Nos. 3,046,127A and 2,951,758A), combinations of triarylimidazole dimers and p-aminophenyl ketones (described in U.S. Pat. No. 3,549,367A), acridine and phenazine compounds (described in JP1985-105667A (JP-S60-105667A) and U.S. Pat. No. 4,239,850A), oxadiazole compounds (described in U.S. Pat. No. 4,212,970A), and acylphosphine oxide compounds (described in JP1988-040799B (JP-S63-040799B), JP1993-029234A (JP-H05-029234A), JP1998-095788A (JP-H10-095788A), and JP1998-029997A (JP-H10-029997A)).

In the present invention, the polymerization initiator is preferably an oxime type polymerization initiator since moisture-heat resistance is improved, and specifically, a polymerization initiator represented by Formula (I) is more preferable.

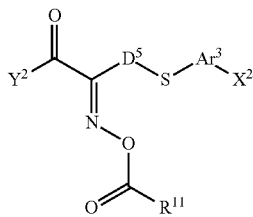

In Formula (I), $X^2$ represents a hydrogen atom or a halogen atom.

In Formula (I), $Ar^3$ represents a divalent aromatic group, and $D^5$ represents a divalent organic group having 1 to 12 carbon atoms.

In Formula (I), $R^{11}$ represents an alkyl group having 1 to 12 carbon atoms, and $Y^2$ represents a monovalent organic group.

Examples of the halogen atom represented by $X^2$ in Formula (I) include a fluorine atom, a chlorine atom, a bromine atom, and an iodine atom, and among these, a chlorine atom is preferable.

Examples of the aromatic ring of the divalent aromatic group represented by $Ar^3$ in Formula (I) include aromatic hydrocarbon rings such as a benzene ring, a naphthalene ring, an anthracene ring, and a phenanthroline ring; and aromatic heterocyclic rings such as a furan ring, a pyrrole ring, a thiophene ring, a pyridine ring, a thiazole ring, and a benzothiazole ring.

Examples of the divalent organic group having 1 to 12 carbon atoms represented by $D^5$ in Formula (I) include a linear or branched alkylene group having 1 to 12 carbon atoms, and specifically, a methylene group, an ethylene group, or a propylene group is preferable.

In Formula (I), the alkyl group having 1 to 12 carbon atoms represented by $R^{11}$ is preferably a methyl group, an ethyl group, or a propyl group.

Examples of the monovalent organic group represented by $Y^2$ in Formula (I) include a functional group having a benzophenone skeleton $((C_6H_5)_2CO)$. Specifically, a functional group including a benzophenone skeleton in which the terminal benzene ring is unsubstituted or monosubstituted as in cases of groups represented by Formulae (Ia) and (Ib) is preferable. In Formulae (Ia) and (Ib), * represents a bonding position, that is, a bonding position with a carbon atom of the carbonyl group in Formula (I).

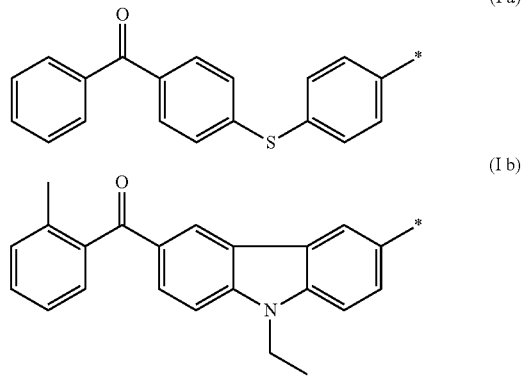

Examples of the oxime type polymerization initiator represented by Formula (I) include a compound represented by Formula (S-1) and a compound represented by Formula (S-2).

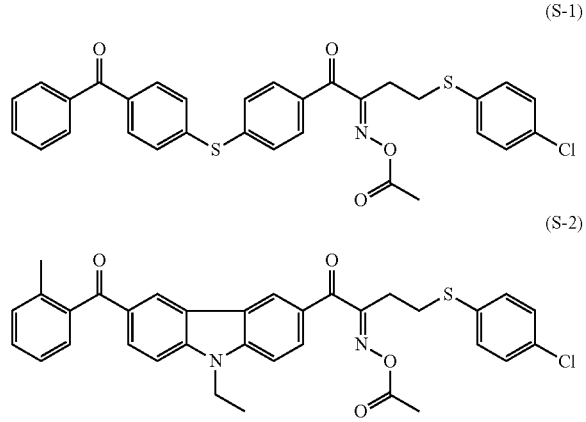 [SMILES: CC(=O)O/N=C(\CCSc1ccc(Cl)cc1)C(=O)c1ccc(Sc2ccc(C(=O)c3ccccc3)cc2)cc1 ; CCn1c2ccc(C(=O)/C(CCSc3ccc(Cl)cc3)=N/OC(C)=O)cc2c2cc(C(=O)c3ccccc3C)ccc21]

The polymerization initiators may be used alone or in combination of two or more kinds thereof.

In the polymerizable liquid crystal composition, the content of the polymerization initiator (in a case where a plurality of kinds of polymerization initiators are contained, the total content thereof) is not particularly limited, and is preferably 0.01 to 20 mass %, and more preferably 0.5 to 5 mass % of the solid content of the polymerizable liquid crystal composition.

<Solvent>

The polymerizable liquid crystal composition preferably contains a solvent from the viewpoint of workability for forming an optically anisotropic film. By appropriately selecting the solvent, the alignment state of the polymerizable liquid crystal compound can be more accurately controlled.

Specific examples of the solvent include ketones (for example, acetone, 2-butanone, methyl isobutyl ketone, methyl ethyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (dichloromethane, dichloroethane, dichlorobenzene, trichloromethane, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

The organic solvents may be used alone or in combination of two or more kinds thereof.

<Leveling Agent>

The polymerizable liquid crystal composition preferably contains a leveling agent from the viewpoint of keeping the surface of the optically anisotropic film smooth and facilitating control of the alignment.

As such a leveling agent, a fluorine-based leveling agent or a silicon-based leveling agent is preferable from the viewpoint of its high leveling effect with respect to the amount added, and a fluorine-based leveling agent is more preferable from the viewpoint of hardly causing bursting (blooming, bleeding).

Specific examples of the leveling agent include the compounds described in paragraphs [0079] to [0102] of JP2007-069471A, the compounds represented by Formula (I) described in JP2013-047204A (particularly, compounds described in paragraphs [0020] to [0032]), the compounds represented by Formula (I) described in JP2012-211306A (particularly, compounds described in paragraphs [0022] to [0029]), the liquid crystal alignment accelerators represented by Formula (I) described in JP2002-129162A (particularly, compounds described in paragraphs [0076] to [0078] and [0082] to [0084]), and the compounds represented by Formulae (I), (II), and (III) described in JP2005-099248A (particularly, compounds described in paragraphs [0092] to [0096]). The leveling agent may also function as an alignment control agent to be described later.

<Alignment Control Agent>

The polymerizable liquid crystal composition may optionally contain an alignment control agent.

With the alignment control agent, various alignment states such as homogeneous alignment, tilt alignment, hybrid alignment, and cholesteric alignment can be formed, and a specific alignment state can be more uniformly and accurately controlled and realized.

As the alignment control agent accelerating homogeneous alignment, for example, a low-molecular-weight alignment control agent and a high-molecular-weight alignment control agent can be used.

Regarding the low-molecular-weight alignment control agent, for example, the description in paragraphs [0009] to [0083] of JP2002-020363A, paragraphs [0111] to [0120] of JP2006-106662A, and paragraphs [0021] to [0029] of JP2012-211306A can be referred to, and the contents thereof are incorporated herein.

Regarding the high-molecular-weight alignment control agent, for example, paragraphs [0021] to [0057] of JP2004-198511A and paragraphs [0121] to [0167] of JP2006-106662A can be referred to, and the contents thereof are incorporated herein.

In a case where the polymerizable liquid crystal composition contains an alignment control agent, the content of the alignment control agent (in a case where a plurality of kinds of alignment control agents are contained, the total content thereof) is preferably 0.01 to 10 mass %, and more preferably 0.05 to 5 mass % with respect to the total solid content mass in the polymerizable liquid crystal composition. In a case where the content of the alignment control agent is within the above range, it is possible to obtain a uniform and highly transparent optically anisotropic film without precipitation, phase separation, alignment defects, and the like while realizing a desired alignment state.

These alignment control agents may further have a polymerizable functional group, particularly, a polymerizable functional group polymerizable with the specific polymerizable liquid crystal compound of the polymerizable liquid crystal composition used in the present invention.

<Other Components>

The polymerizable liquid crystal composition may contain a component other than the components described above. Examples of other components include a liquid crystal compound other than the polymerizable liquid crystal compound described above, a surfactant, a tilt angle control agent, an alignment aid, a plasticizers, and a crosslinking agent. Preferable examples of the alignment aid include HISOLVE MTEM (manufactured by TOHO Chemical Industry Co., Ltd.) and NK ester A-200 (manufactured by Shin-Nakamura Chemical Co., Ltd.).

The method of forming an optically anisotropic film formed of the polymerizable liquid crystal composition having the components is not particularly limited.

For example, on the photo alignment film described above, the polymerizable liquid crystal composition is applied to form a coating film, the obtained coating film is subjected to a curing treatment (light irradiation treatment (for example, ultraviolet irradiation treatment) or heating treatment), and thus an optically anisotropic film can be formed. It is preferable that the step of forming an optically anisotropic film is performed continuously with the step of forming a photo alignment film as shown in FIG. 3.

<Method of Forming Optically Anisotropic Film>

The polymerizable liquid crystal composition can be applied by a known method such as a wire bar coating method, an extrusion coating method, a direct gravure coating method, a reverse gravure coating method, and a die-coating method. In FIG. 3, the polymerizable liquid crystal composition is applied by a die 35.

In removing the solvent from the coating film, a heating step same as that described in the photo alignment film forming method can be applied. By controlling extraction of the component derived from the additive of the polymer support and diffusion in the coating film by adjusting the heating conditions, particularly, the conditions for removing the solvent from the coating film, the alignment state of the optically anisotropic film can be improved.

In FIG. 3, the heating step is performed by a heating device 36.

In the polymerization process related to the fixing of the alignment state, a process of exposure by a light source 37 is shown in FIG. 3, and a known light source can be used without limitations as the light source. In addition, in a case where a polymerizable liquid crystal compound which is thermally polymerizable is used, a heating device can be provided instead of the light source 37, and the heating device 36 can also function as the above heating device. In a roll-to-roll process, the produced optical film can be wound as a wound body (roll) 39.

[Polarizing Plate]

By attaching the optical film according to the embodiment of the present invention to a polarizer, a polarizing plate having various functions can be formed. In addition, in a case where the optically anisotropic film in the optical film according to the embodiment of the present invention is peelable from the photo alignment film, the polarizing plate can be formed by attaching the optically anisotropic film transferred from the optical film to the polarizer.

The polarizer is not particularly limited as long as it is a member having a function of converting light into specific linearly polarized light, and an absorption type polarizer or a reflective type polarizer which has been known can be used.

As the absorption type polarizer described above, an iodine-based polarizer, a dye-based polarizer using a dichroic dye, a polyene-based polarizer, or the like is used. Iodine-based polarizers and dye-based polarizers include coating type polarizers and stretch type polarizers, and any of these can be applied. However, a polarizer produced by adsorbing iodine or a dichroic dye onto polyvinyl alcohol and stretching the polyvinyl alcohol is preferable.

In addition, examples of the method of obtaining a polarizer by subjecting a laminate film obtained by forming a polyvinyl alcohol layer on the base material to stretching and dyeing include methods disclosed in JP5048120B, JP5143918B, JP5048120B, JP4691205B, JP4751481B, and JP4751486B. Known techniques related to these polarizers can also be preferably used.

As the reflective type polarizer, a polarizer obtained by laminating thin films having different birefringences, a wire grid type polarizer, a polarizer obtained by combining a cholesteric liquid crystal having a selective reflection region with a ¼ wavelength plate, or the like is used.

Among these, a polarizer including a polyvinyl alcohol-based resin (a polymer including $-CH_2-CHOH-$ as a repeating unit, particularly, at least one selected from the group consisting of polyvinyl alcohol and an ethylene-vinyl alcohol copolymer) is preferable in view of handleability.

The thickness of the polarizer is not particularly limited, and is preferably 1 to 60 μm, more preferably 1 to 30 μm, and even more preferably 2 to 20 μm.

In the polarizing plate described above, the polarizer is preferably supported or sandwiched with a polymer film. Specific examples of the polymer of the polymer film include cellulose-based polymers; acrylic polymers such as acrylic polymers having an acrylic acid ester polymer such as polymethylmethacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing the above polymers.

Among these, cellulose-based polymers typified by triacetyl cellulose (hereinafter, also referred to as "cellulose acylate") are preferably used. Acrylic polymers are also preferably used from the viewpoint of workability and optical performance.

As a film formed of a cellulose-based polymer or an acrylic polymer, a film same as the polymer support described above can be used. The polarizing plate may be obtained by attaching the above-described polymer support to a polarizer.

The thickness of the polymer film is not particularly limited, and is preferably 40 μm or less since the thickness of the polarizing plate can be reduced. The lower limit is not particularly limited, but is usually 5 μm or greater in consideration of handleability of the polarizing plate.

The configuration of the polarizing plate will be described below with reference to FIGS. 2A and 2B.

Figure 2A:
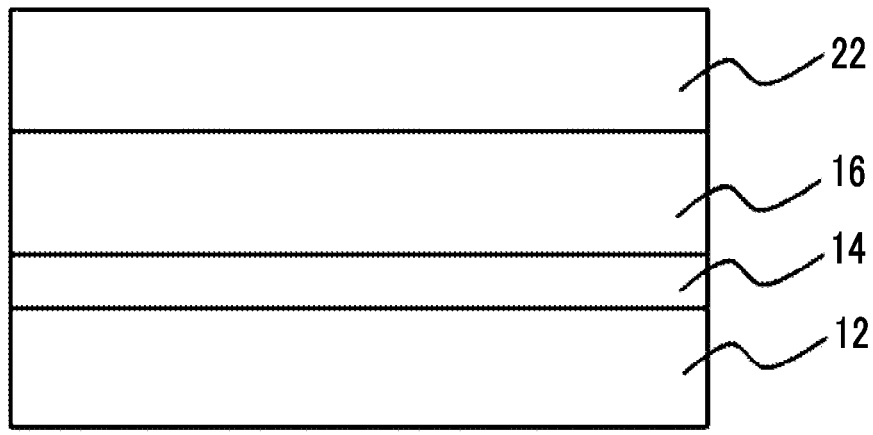
FIG. 2A is a schematic cross-sectional view showing an example of a polarizing plate including the optical film according to the embodiment of the present invention.

FIG. 2A is a conceptual diagram of a polarizing plate 20 having a linear polarizer 22, a polymer support 16, a photo alignment film 14, and an optically anisotropic film 12 in this order. An adhesive layer (not shown) may be optionally provided between the linear polarizer 22 and the polymer support 16, and a polymer film (not shown) may be provided on a surface of the linear polarizer 22 opposite to the polymer support 16.

Figure 2B:
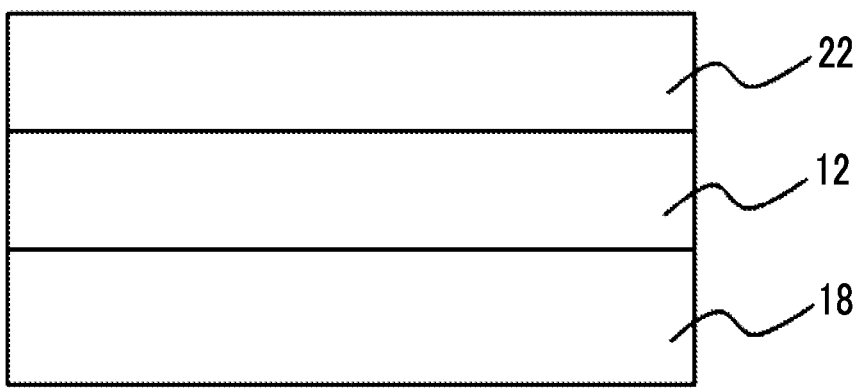
FIG. 2B is a schematic cross-sectional view showing an example of a polarizing plate including an optically anisotropic film transferred from the optical film according to the embodiment of the present invention.

FIG. 2B shows a conceptual diagram of a polarizing plate having a linear polarizer 22, an optically anisotropic film 12 transferred from the optical film according to the embodiment of the present invention, and a positive C plate 18 in this order. An adhesive layer (not shown) such as a pressure-sensitive adhesive layer and an optional polymer film (not shown) may be provided between the layers.

[Circularly Polarizing Plate]

In a case where the optical film according to the embodiment of the present invention or the optically anisotropic film transferred from the optical film according to the embodiment of the present invention has characteristics of a λ/4 plate, the absorption axis of the linear polarizer to be combined and the slow axis of the optical film according to the embodiment of the present invention or the optically anisotropic film transferred from the optical film according to the embodiment of the present invention are allowed to intersect at 45°, and thus a circularly polarizing plate can be obtained.

Furthermore, in a case where the circularly polarizing plate is used as an external light antireflection layer of an image display device to be described later, the intersecting angle between the absorption axis of the linear polarizer to be combined and the slow axis of the optical film according to the embodiment of the present invention or the optically anisotropic film of the optical film according to the embodiment of the present invention is preferably adjusted in a range of 45°±8° to adjust the tint of reflected light.

[Other Layers]

The polarizing plate described above may further include a layer other than the optical film according to the embodiment of the present invention, the optically anisotropic film transferred from the optical film according to the embodiment of the present invention, and the optional polymer film described above. Specific examples of the layer include a decorative layer, an adhesive layer, a light diffusion layer, a gas barrier layer, a colored layer, a conductive layer (touch panel), and an antistatic layer. For example, a positive C plate and other retardation films may be further combined to optimize the polarization conversion of obliquely transmitted light.

[Image Display Device]

The optical film according to the embodiment of the present invention or the polarizing plate described above can be applied to an image display device.

The display element which is used in the image display device according to the embodiment of the present invention is not particularly limited, and examples thereof include a liquid crystal cell, an organic electroluminescence (hereinafter, abbreviated as "EL") display panel, a plasma display panel, and a micro LED display panel. The optical film according to the embodiment of the present invention or the polarizing plate described above can also be used for optical compensation for improving the display image quality, and for suppressing deterioration of the display image quality due to external light which is reflected by the display element.

[Liquid Crystal Display Device]

Examples of the liquid crystal display device to which the above-described optical film according to the embodiment of the present invention or the optically anisotropic film transferred from the optical film according to the embodiment of the present invention is applied include a liquid crystal display device having a polarizing plate in which the above-described optical film according to the embodiment of the present invention or the optically anisotropic film transferred from the optical film according to the embodiment of the present invention is attached, and a liquid crystal cell.

In the present invention, the polarizing plate described above is preferably used as a front one of polarizing plates provided on both sides of the liquid crystal cell. A positive C plate or the like can be further optionally combined to improve the display performance in the oblique viewing direction.

Hereinafter, the liquid crystal cell of the liquid crystal display device will be described in detail.

<Liquid Crystal Cell>

The liquid crystal cell used in the liquid crystal display device is preferably a vertical alignment (VA) mode, an optical compensated bend (OCB) mode, an in-place-switching (IPS) mode, or a twisted nematic (TN) mode, and is not limited thereto.

In a TN mode liquid crystal cell, rod-like liquid crystal molecules are substantially horizontally aligned when no voltage is applied, and further twisted and aligned at 60° to 120°. The TN mode liquid crystal cell is most frequently used as a color thin-film-transistor liquid-crystal display (TFT) liquid crystal display device, and is described in many literatures.

In a VA mode liquid crystal cell, rod-like liquid crystal molecules are substantially vertically aligned when no voltage is applied. The VA mode liquid crystal cell includes: (1) a narrow-sense VA mode liquid crystal cell in which rod-like liquid crystal molecules are substantially vertically aligned when no voltage is applied, and substantially horizontally aligned when a voltage is applied (described in JP1990-176625A (JP-H2-176625A)), (2) a (MVA mode) liquid crystal cell (SID97, Digest of tech. Papers (proceedings) 28 (1997) 845) obtained by forming multi-domains in the VA mode in order to expand the viewing angle, (3) a (n-ASM mode) liquid crystal cell having a mode in which rod-like liquid crystal molecules are substantially vertically aligned when no voltage is applied and are twisted and multi-domain-aligned when a voltage is applied (described in Proceedings 58 and 59 (1998) of Japanese Liquid Crystal Conference), and (4) a SURVIVAL mode liquid crystal cell (disclosed in LCD International 98). In addition, the VA mode liquid crystal cell may be any one of a patterned vertical alignment (PVA) type liquid crystal cell, an optical alignment type liquid crystal cell, or a polymer-sustained alignment (PSA) type liquid crystal cell. Details of these modes are described in JP2006-215326A and JP2008-538819A.

In an IPS mode liquid crystal cell, rod-like liquid crystal molecules are aligned substantially parallel to the substrate, and the liquid crystal molecules respond in a planar manner by application of a planar electric field to the substrate surface. In the IPS mode, black is displayed in a state in which no electric field is applied, and the absorption axes of a pair of upper and lower polarizing plates are orthogonal to each other. A method of improving a viewing angle by reducing leakage of light during black display in an oblique direction by using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

In an organic EL display device, in a case where a circularly polarizing plate in which the optical film according to the embodiment of the present invention or the optically anisotropic film transferred from the optical film according to the embodiment of the present invention is attached is used, external light is reflected on an electrode of an organic EL panel or the like, and thus a display contrast reduction phenomenon can be suppressed and high-quality display can be performed. A known configuration can be widely used as the organic EL panel, and a touch panel can be further provided. By further combining the above-described circularly polarizing plate with a positive C plate, it is possible to form a display device exhibiting an excellent reflection tint even in the oblique viewing direction.

EXAMPLES

Hereinafter, the present invention will be described in more detail with reference to examples. Materials, used amounts, proportions, processing contents, processing orders, and the like shown in the following examples can be appropriately changed without departing from the spirit of the present invention. Therefore, the scope of the present invention should not be limitedly interpreted by the following examples.

[Synthesis of Polymer A]

<Synthesis of Polymer Ap1>

60.0 parts by mass of n-butoxymethyl acrylate, 40.0 parts by mass of acrylamide, 4.8 parts by mass of 2,2'-azobis (isobutyronitrile) as a polymerization initiator, and 313.9 parts by mass of propylene glycol monomethyl ether were put into a flask comprising a cooling pipe, a thermometer, and a stirrer, and reacted at 85° C. for 20 hours to obtain a solution of a polymer Ap1 having a crosslinkable group (concentration of solid contents: 25 mass %). In the obtained polymer Ap1, Mn was 3,560 and Mw was 4,820.

<Synthesis of Polymer Ap2>

The following monomer m-1 was synthesized using 2-hydroxyethyl methacrylate (HEMA) (TOKYO CHEMICAL INDUSTRY CO., LTD.) and the following cinnamic acid chloride derivative according to the method described in Langmuir, 32 (36), 9245-9253, (2016).

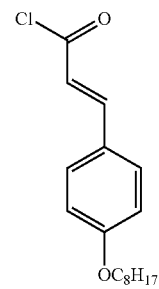

Cinnamic Acid
Chloride Derivative

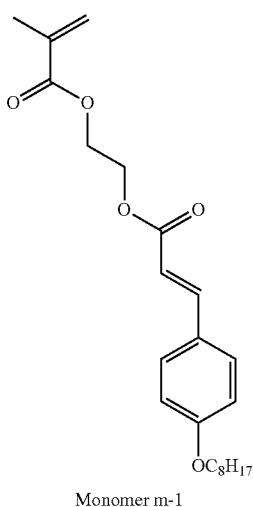

Monomer m-1

5 parts by mass of 2-butanone as a solvent was put into a flask comprising a cooling pipe, a thermometer, and a stirrer, and refluxing was performed by water bath heating with nitrogen flowing at 5 mL/min in the flask. To the resulting material, a solution obtained by mixing 5 parts by mass of the monomer m-1, 5 parts by mass of 3,4-epoxycyclohexylmethyl methacrylate (CYCLOMER M100, manufactured by Daicel Corporation), 1 part by mass of 2,2'-azobis(isobutyronitrile) as a polymerization initiator, and 5 parts by mass of 2-butanone as a solvent was added dropwise for 3 hours, and stirred for 3 hours while a reflux state is maintained. After completion of the reaction, the mixture was allowed to cool to room temperature and diluted by adding 30 parts by mass of 2-butanone to obtain about 20 mass % of a polymer solution. The obtained polymer solution was poured into a large excess of methanol to precipitate the polymer, and the recovered precipitate was filtered, washed with a large amount of methanol, and then blast dried at 50° C. for 12 hours to obtain a polymer Ap2 having a crosslinkable group and a photo-aligned group.

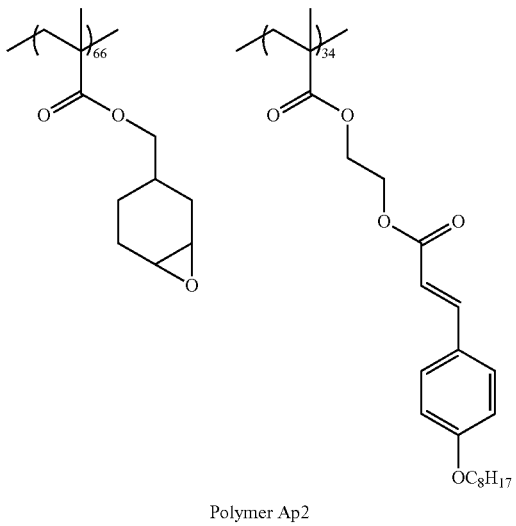

Polymer Ap2

<Synthesis of Polymer Ap3>

2.5 parts by mass of a methacrylic acid, 9.2 parts by mass of methyl methacrylate, 5.0 parts by mass of 2-hydroxyethyl methacrylate, 0.2 parts by mass of 2,2'-azobis(isobutyronitrile) as a polymerization initiator, and 50.7 parts by mass of propylene glycol monomethyl ether were put into a flask comprising a cooling pipe, a thermometer, and a stirrer, and reacted at 70° C. for 20 hours to obtain a solution of a polymer Ap3 having a crosslinkable group (concentration of solid contents: 25 mass %). In the obtained acrylic copolymer, Mn was 19,600, and Mw was 45,200.

[Preparation of Photo Alignment Film Composition]

Photo alignment film compositions having the following compositions (P-1, P-2, and P-3) were prepared. In each of the obtained compositions, each polymer and other components were sufficiently dissolved in the solvent according to the amounts added.

| Photo Alignment Film Composition (P-1) | |
|---|---|
| Compound CIN-1 | 1.00 part by mass |
| Solution of Above Polymer Ap1 (solid content: 35 mass %) | 2.90 parts by mass |
| Solution of Above Polymer Ap3 (solid content: 25 mass %) | 4.00 parts by mass |
| Paratoluenesulfonic Acid Monohydrate | 0.10 parts by mass |
| Propylene Glycol Monomethyl Ether | 43.7 parts by mass |

Compound CIN-1: 4-(6-hydroxyhexyloxy)cinnamic acid methyl ester

| Photo Alignment Film Composition (P-2) | |
|---|---|
| Above Polymer Ap1 | 4.60 parts by mass |
| Following Compound B2 | 0.80 parts by mass |
| Following Crosslinking Agent C-1 | 3.00 parts by mass |
| Compound D1 | 0.80 parts by mass |
| Butyl Acetate | 120 parts by mass |

(Compound B2)

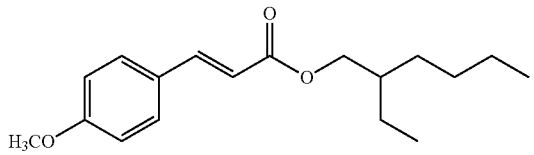

B2

(Crosslinking Agent C-1) polyfunctional epoxy compound (EPOLEAD GT401, manufactured by Daicel Corporation)

(Compound D1) thermal acid generator (SAN AID SI-60, manufactured by Sanshin Chemical Industry Co., Ltd.)

| Photo Alignment Film Composition (P-3) | |
|---|---|
| Above Polymer Ap2 | 10.00 parts by mass |
| Above Compound D1 | 0.50 parts by mass |
| Isopropyl Alcohol | 1.65 parts by mass |
| Butyl Acetate | 107.20 parts by mass |
| Methyl Ethyl Ketone | 26.80 parts by mass |

[Preparation of Optically Anisotropic Film Composition]

Optically anisotropic film coating liquids having the following compositions (A-1 to A-3) were prepared.

| Optically Anisotropic Film Coating Liquid (A-1) | |
|---|---|
| Following Polymerizable Liquid Crystal Compound L-1 | 42.00 parts by mass |
| Following Polymerizable Liquid Crystal Compound L-2 | 42.00 parts by mass |
| Following Polymerizable Compound A-1 | 16.00 parts by mass |
| Following Polymerization Initiator S-1 | 0.50 parts by mass |
| Leveling Agent (following compound G-1) | 0.20 parts by mass |
| HISOLVE MTEM (manufactured by TOHO Chemical Industry Co., Ltd) | 2.00 parts by mass |

-continued

| Optically Anisotropic Film Coating Liquid (A-1) | |
|---|---|
| NK Ester A-200 (manufactured by Shin-Nakamura Chemical Co., Ltd.) | 1.00 parts by mass |
| Methyl Ethyl Ketone | 424.8 parts by mass |

The group adjacent to the acryloyloxy group of the following polymerizable liquid crystal compounds L-1 and L-2 represents a propylene group (a group in which a methyl group is substituted with an ethylene group), and the following polymerizable liquid crystal compounds L-1 and L-2 represent a mixture of regioisomers with different methyl group positions.

(Polymerizable Liquid Crystal Compound L-1)

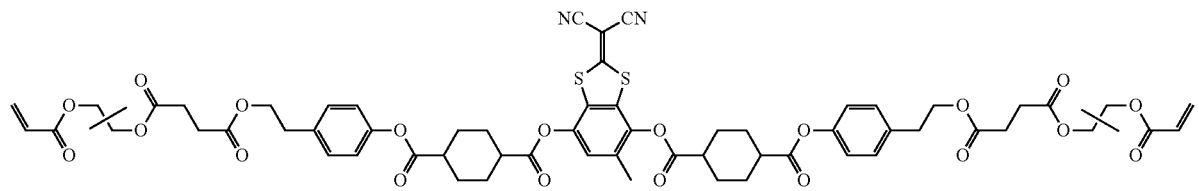

Me Regioisomer Mixture (Polymerizable Liquid Crystal Compound L-2)

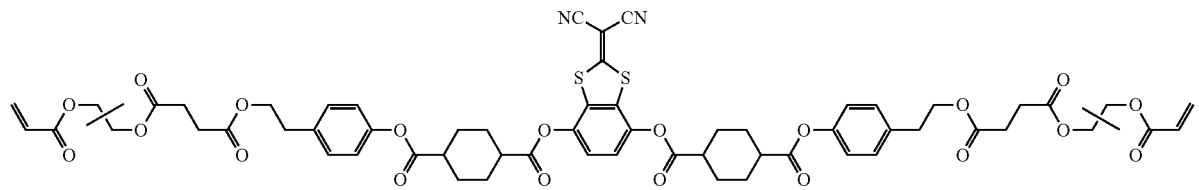

Me Regioisomer Mixture (Polymerizable Compound A-1)

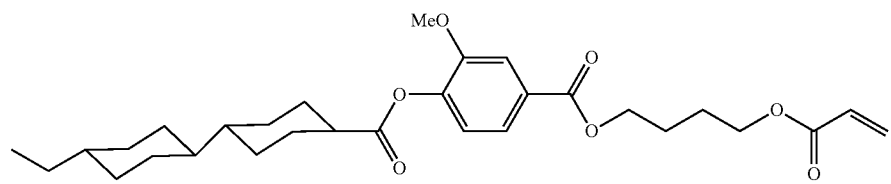

A-1

(Polymerization Initiator S-1)

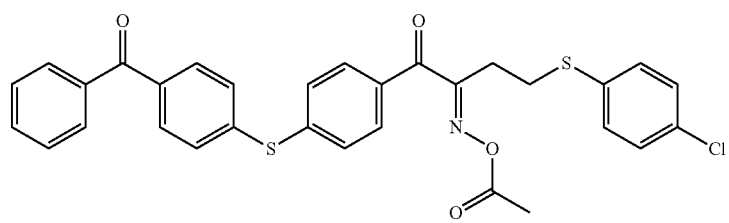

S-1

(Compound G-1)

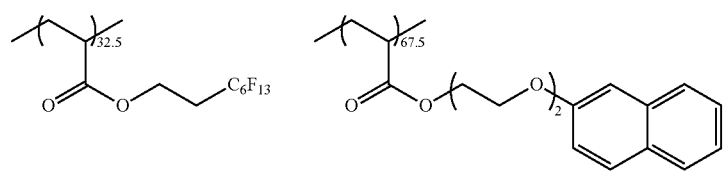

| (Optically Anisotropic Film Coating Liquid A-2) | |
| --- | --- |
| Following Polymerizable Liquid Crystal Compound L-3 | 95.00 parts by mass |
| Following Polymerizable Liquid Crystal Compound L-4 | 5.00 parts by mass |
| Above Polymerization Initiator S-1 | 0.50 parts by mass |
| Above Leveling Agent G-1 | 0.20 parts by mass |
| Cyclopentanone | 570.00 parts by mass |

(Polymerizable Liquid Crystal Compound L-3)

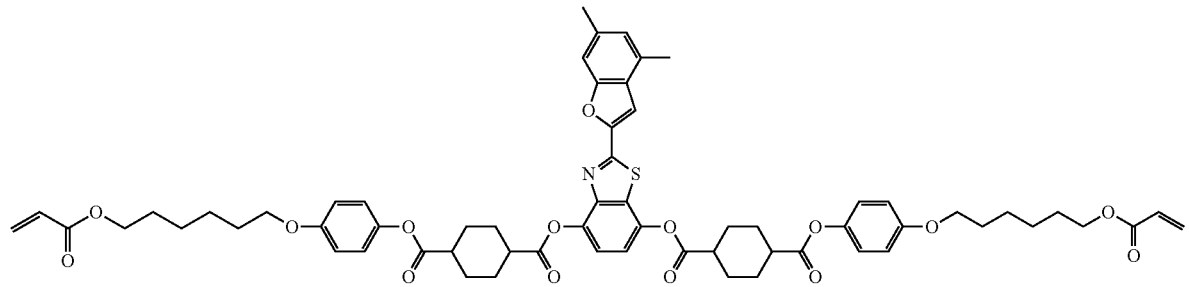

(Polymerizable Liquid Crystal Compound L-4)

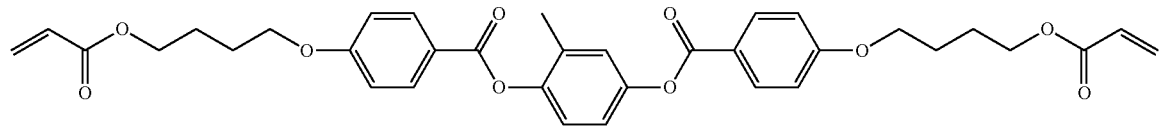

| Optically Anisotropic Film Coating Liquid (A-3) | |
| --- | --- |
| Above Polymerizable Liquid Crystal Compound L-1 | 42.00 parts by mass |
| Above Polymerizable Liquid Crystal Compound L-2 | 42.00 parts by mass |
| Above Polymerizable Compound A-1 | 16.00 parts by mass |
| Above Polymerization Initiator S-1 | 0.50 parts by mass |
| Leveling Agent (above compound G-1) | 0.20 parts by mass |
| HISOLVE MTEM (manufactured by TOHO Chemical Industry Co., Ltd) | 2.00 parts by mass |
| NK Ester A-200 (manufactured by Shin-Nakamura Chemical Co., Ltd.) | 1.00 parts by mass |
| Cyclopentanone | 424.8 parts by mass |

[Production of Cellulose Acylate Film 1]

(Production of Core Layer Cellulose Acylate Dope)

The following composition was put into a mixing tank and stirred to dissolve the components, and a cellulose acetate solution to be used as a core layer cellulose acylate dope was prepared.

| Core Layer Cellulose Acylate Dope | |
| --- | --- |
| Cellulose Acetate Having Acetyl Substitution Degree of 2.88 | 100 parts by mass |
| Polyester Compound B Described in Example of JP2015-227955A | 12 parts by mass |
| Following Compound F | 2 parts by mass |
| Methylene Chloride (first solvent) | 430 parts by mass |
| Methanol (second solvent) | 64 parts by mass |

(Compound F)

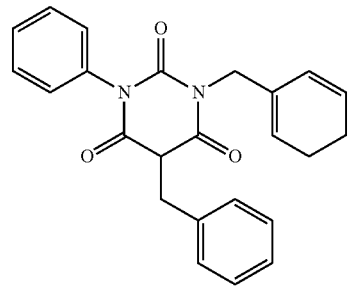

(Production of Outer Layer Cellulose Acylate Dope)

10 parts by mass of the following matting agent solution was added to 90 parts by mass of the core layer cellulose acylate dope to prepare a cellulose acetate solution to be used as an outer layer cellulose acylate dope.

| Matting Agent Solution | |
| --- | --- |
| Silica Particles Having Average Particle Size of 20 nm (AEROSIL R972, manufactured by NIPPON AEROSIL CO., LTD.) | 2 parts by mass |
| Methylene Chloride (first solvent) | 76 parts by mass |
| Methanol (second solvent) | 11 parts by mass |
| Above Core Layer Cellulose Acylate Dope | 1 part by mass |

(Production of Cellulose Acylate Film 1)

The core layer cellulose acylate dope and the outer layer cellulose acylate dope were filtered through filter paper having an average pore size of 34 μm and a sintered metal filter having an average pore size of 10 μm. Then, three layers of the core layer cellulose acylate dope and the outer layer cellulose acylate dopes on both sides of the core layer cellulose acylate dope were simultaneously cast from a casting port onto a drum at 20° C. (band casting machine). In a state in which the solvent content of the film on the drum was about 20 mass %, the film was peeled, both ends of the film in a width direction were fixed with tenter clips, and the film was dried while being stretched in a transverse direction at a stretching ratio of 1.1 times. Then, the film was further dried by being transported between rolls of a heat treatment device, and a cellulose acylate film having a thickness of 40 μm was produced. The film was used as a polymer support of Example 1 (cellulose acylate film 1). The core layer of the cellulose acylate film 1 had a thickness of 36 μm, and the outer layers disposed on both sides of the core layer had a thickness of 2 μm. The in-plane retardation of the obtained cellulose acylate film 1 at a wavelength of 550 nm was 0 nm, and the retardation in a thickness direction was 1 nm.

Example 1

(Production of Optical Film)

The photo alignment film composition P-1 prepared previously was continuously applied to one surface of the cellulose acylate film 1 while the produced long cellulose acylate film 1 was fed and transported.

After the application, the composition was heated for 150 seconds in an atmosphere at 115° C. while being transported, and a photoisomerization composition layer having a thickness of 0.2 μm was formed.

The obtained photoisomerization composition layer was irradiated with polarized ultraviolet rays (10 mJ/cm$^2$, using an ultrahigh-pressure mercury lamp), and thus a photo alignment film PA-1 was formed.

Next, the optically anisotropic film coating liquid A-1 prepared previously was continuously applied to the photo alignment film to form a composition layer (coating film).

The composition layer thus formed was heated to 110° C., and then cooled to 60° C. to stabilize the alignment. Then, the temperature was kept at 60° C., and the alignment was fixed by ultraviolet irradiation (500 mJ/cm$^2$, using an ultrahigh-pressure mercury lamp) under a nitrogen atmosphere (oxygen concentration: 100 ppm) to form an optically anisotropic film having a thickness of 2.3 μm. An optical film 1 of Example 1 was produced. The in-plane retardation of the obtained optical laminate at a wavelength of 550 nm was 140 nm.

Examples 2 to 4 and Comparative Example 1

The thickness of the photo alignment film composition and/or the photo alignment film was changed as shown in Table 2 to produce optical films 2 to 4 of Examples 2 to 4 and an optical film 11 of Comparative Example 1. The thickness of the photo alignment film was changed by changing the amount of the photo alignment film composition applied per area. In addition, the in-plane retardation of the optically anisotropic film of each film at a wavelength of 550 nm was adjusted to 140 nm by adjusting the amount of the optically anisotropic film forming composition applied per area.

Example 5

An optical film 5 of Example 5 was produced in the same manner as in Example 2, except that an optically anisotropic film coating liquid A-3 was used as the optically anisotropic film forming composition. The in-plane retardation of the optically anisotropic film at a wavelength of 550 nm was 140 nm.

Example 6

An optical film 6 of Example 6 was produced in the same manner as in Example 2, except that an optically anisotropic film coating liquid A-2 was used as the optically anisotropic film forming composition. The in-plane retardation of the optically anisotropic film at a wavelength of 550 nm was 140 nm.

Comparative Example 2

An optical film 12 of Comparative Example 2 was produced in the same manner as in Example 1, except that instead of the cellulose acylate film 1, a polyethylene terephthalate film (FD100, manufactured by FUJIFILM Corporation, referred to as film 2 in the table) was used as the film 2 in Example 1.

Comparative Example 3

An optical film 13 of Comparative Example 3 was produced in the same manner as in Example 1, except that the heating time for the photoisomerization composition layer was set to 100 seconds in Example 1.

(Evaluation of Photo Alignment Film)

<Adhesiveness Between Support and Photo Alignment Film>

In the optical film production process described above, the laminate in which the photo alignment film was laminated on the support was taken out, and subjected to a cross cut tape peeling test according to JIS D0202-1988. A cellophane tape (trade name: CT24, manufactured by NICHIBAN Co., Ltd.) was used to adhere to the film with a rubbing rod, and then peeled. Determination was shown by the number of grids peeled out of 100 grids, and evaluation was performed according to the following criteria.

A: No grids peeled
B: Peeling of 1 to 9 grids is seen.
C: The number of grids peeled is 10 or more.

(Evaluation of Optical Film)

<Amount of Component Derived from Support in Surface of Photo Alignment Film>

[Preparation of Calibration Curve]

Compositions P-1 (0.1) and P-1 (1.0) for calibration curve preparation in which the polyester compound B described above was added to the photo alignment film composition P-1 in an amount of 0.1 mass % and 1.0 mass %, respectively, with respect to the total solid content of the composition P-1 were prepared. The photo alignment film composition P-1 and the compositions P-1 (0.1) and P-1 (1.0) for calibration curve preparation were respectively spin-coated on a washed glass plate, and then heated at 120° C. for 1 minute to produce model films having a thickness of 0.3 μm provided on the glass plate.

Using a mass spectrometer "TRIFT V Nano TOF (primary ion: $Bi_3^{++}$, accelerating voltage: 30 kV)" manufactured by ULVAC-PHI, INC., the sum of fragment ions derived from the polyester compound B contained in the film in the film thickness direction was standardized by a total amount of ions detected while the obtained model films were etched by an Ar-GCIB gun (15 kV, 2.5 nA, 500 μm square), whereby the ratio of the polyester compound B contained in the photo alignment film composition P-1 was measured, and the correlation between the amount of ions detected and the amount of the polyester compound B contained in the calculation was thus obtained to prepare a calibration curve of the content of the polyester compound B contained in the photo alignment film.

A calibration curve of the content of the compound F described above was also prepared in the same manner.

In addition, regarding the photo alignment film compositions P-2 and P-3, calibration curves of the content of the polyester compound B and the content of the compound F were prepared by the same procedure.

[Analysis of Surface of Photo Alignment Film]

In the optical films 1, 2, 4, 5, 6, 11, 12, and 13 produced, the optically anisotropic film was removed from the photo alignment film using a pressure sensitive adhesive tape, and then a surface of the exposed photo alignment film PA-1 was analyzed by a secondary ion mass spectrometer. The optical film 3 produced was obliquely cut at an angle of 0.6° from the film surface, and a portion of the photo alignment film shown on the cut surface was analyzed by a secondary ion mass spectrometer. From the standardized secondary ion peak amounts of the compounds obtained, the total amount of the compounds was calculated based on the above-described calibration curves. That is, the amount (mass %) of the component derived from the additive of the polymer support contained in the boundary region with the optically anisotropic film in the photo alignment film with respect to the total mass of the photo alignment film was obtained. The results are shown in Table 2.

<Alignment Property>

The produced optical film was observed using a polarizing microscope in a state of being shifted by 2 degrees from the extinction position. As a result, evaluation was performed according to the following criteria. The results are shown in the following Table 2.

A: The liquid crystal directors are uniformly aligned.

B: The liquid crystal directors are not misaligned, and the plane state is stable.

C: The liquid crystal directors are partially misaligned, and the plane state is stable.

D: The liquid crystal directors are widely misaligned, and the plane state is not stable.

<Wavelength Dispersion>

Using AxoScan OPMF-1 (manufactured by OPTO SCIENCE, INC.), the measurement was performed with the use of light of an in-plane retardation (Re (450 nm) and Re (550 nm)) measurement wavelength, and a value of wavelength dispersion Re (450 nm)/Re (550 nm) is shown.

In Table 2, "unmeasurable" in Comparative Example 3 means that measurement was not possible due to the extremely low alignment property.

TABLE 2

| | | Optical Film | | | | | | | |
|---|---|---|---|---|---|---|---|---|---|
| | | Configuration | | | | | | Evaluation | |
| | | Polymer Support | Photo Alignment Film | | | | | | |
| | No. | Polymer Support | No. | Photo Alignment Film Composition | Thickness (μm) | Amount of Additive in Interface (mass %) | Optically Anisotropic Film Forming Composition | Alignment Property | Adhesiveness Between Support and Photo Alignment Film | Wavelength Dispersion Re (450)/Re (550) |
| Example 1 | 1 | Cellulose Acylate Film 1 | PA-1 | P-1 | 0.2 | 0.15 | A-1 | A | A | 0.86 |
| Example 2 | 2 | Cellulose Acylate Film 1 | PA-2 | P-1 | 0.3 | 0.42 | A-1 | A | A | 0.86 |
| Example 3 | 3 | Cellulose Acylate Film 1 | PA-3 | P-2 | 0.3 | 0.12 | A-1 | A | A | 0.86 |
| Example 4 | 4 | Cellulose Acylate Film 1 | PA-4 | P-3 | 0.3 | 0.12 | A-1 | A | A | 0.86 |
| Example 5 | 5 | Cellulose Acylate Film 1 | PA-2 | P-1 | 0.3 | 0.42 | A-3 | A | A | 0.86 |
| Example 6 | 6 | Cellulose Acylate Film 1 | PA-2 | P-1 | 0.3 | 0.42 | A-2 | B | A | 0.86 |
| Comparative Example 1 | 11 | Cellulose Acylate Film 1 | PA-11 | P-1 | 0.4 | 0.65 | A-1 | C | A | 0.86 |
| Comparative Example 2 | 12 | Film 2 | PA-12 | P-1 | 0.2 | 0.00 | A-1 | B | C | 0.86 |
| Comparative Example 3 | 13 | Cellulose Acylate Film 1 | PA-13 | P-1 | 0.2 | 0.70 | A-1 | D | B | unmeasurable |

In Examples 1 to 6, the adhesiveness was excellent, and the liquid crystal compound had a good alignment state due to the appropriate photo alignment film forming composition and the appropriate photo alignment film forming conditions.

According to comparison of Examples 2, 5, and 6, in a case where the specific polymerizable liquid crystal compound corresponds to a compound represented by one of Formulae (1-1) to (1-14), the alignment state of the liquid crystal compound in the optical film to be obtained was improved.

In contrast, in Comparative Examples 1 to 3, since the action of the polymer support and the photo alignment film forming composition, and the photo alignment film forming conditions were not properly designed, the adhesiveness between the polymer support and the photo alignment film and/or the uniformity of the alignment state of the liquid crystal compound was poor.

More specifically, in Comparative Example 1, the reason for this is presumed to be that since the coating film of the photo alignment film forming composition (photoisomerization composition layer) formed on the polymer support is thick, the amount of the solvent acting on the polymer support is increased, and this causes the component derived from the additive of the polymer support to be excessively extracted to the photoisomerization composition layer. As a result, the optical film to be obtained is thought to be excellent in the adhesiveness between the polymer support and the photo alignment film, but be poor in the uniformity of the alignment state of the liquid crystal compound in the photoisomerization composition layer.

In Comparative Example 2, it is thought that since the solvent in the photo alignment film forming composition does not or extremely slightly acts to swell the surface of the polymer support, the adhesiveness between the polymer support and the photo alignment film in the optical film to be obtained does not meet the desired requirements.

In Comparative Example 3, the reason for this is presumed to be that the crosslinking density of the photo alignment film is low due to the reduced heating time for the coating film of the photo alignment film forming composition (photoisomerization composition layer), and this causes the component derived from the additive of the polymer support to be excessively extracted to the photoisomerization composition layer in the formation of the coating film of the optically anisotropic film forming composition on the photo alignment film. As a result, the optical film to be obtained is thought to be poor in the uniformity of the alignment state of the liquid crystal compound in the photoisomerization composition layer.

[Evaluation of Antireflection Plate (Circularly Polarizing Plate) for Organic EL]

(Production of Positive C Plate Film 1)

A film having a positive C plate film C-1 was produced on a temporary support for formation in the same manner as in the case of the positive C plate described in paragraph of JP2015-200861A. The thickness of the positive C plate was controlled such that Rth (550) was −69 nm.

(Production of Circularly Polarizing Plate 1)

A pressure sensitive adhesive layer was provided on the optically anisotropic film of the optical film 1 of Example 1 to attach the optical film to a polarizing plate, and then the cellulose acylate film 1 was peeled and removed to produce a laminate in which the polarizing plate and the optically anisotropic film were attached to each other with the pressure sensitive adhesive. The positive C plate film C-1 produced as above was transferred to the optically anisotropic film side via a pressure sensitive adhesive, and the temporary support for formation was removed to obtain a circularly polarizing plate 1.

(Production of Circularly Polarizing Plates 2, 4, 5, and 6)

Circularly polarizing plates 2, 4, 5 and 6 were produced in the same manner as in the case of the circularly polarizing plate 1, except that the optical films 2, 4, 5, and 6 of Examples 2, 4, 5, and 6 were used instead of the optical film of Example 1, respectively.

(Production of Circularly Polarizing Plate 3)

The positive C plate film C-1 produced as above was transferred to the optically anisotropic film side of the optical film 3 of Example 3 via a pressure sensitive adhesive, and the temporary support for formation was removed. A polarizing plate was attached to the side of the cellulose acylate film 1 of the optical laminate via a pressure sensitive adhesive to obtain a circularly polarizing plate 3.

(Mounting on Organic EL Panel and Evaluation)

Next, GALAXY SII manufactured by SAMSUNG equipped with an organic EL panel was disassembled to peel a circularly polarizing plate therefrom. The circularly polarizing plates 1 to 6 produced as above were respectively attached via a pressure sensitive adhesive such that the positive C plate side was on the panel side, and display devices corresponding thereto were produced.

White display, black display, and image display were performed on the obtained display device, and the reflected light when fluorescent light was projected at a polar angle of 60 degrees was observed. The display device formed of any circularly polarizing plate had no light leakage in black state, had a neutral panel tint during black display, and was extremely excellent as a display device.

EXPLANATION OF REFERENCES

10: optical film
3, 12: optically anisotropic film
2, 14: photo alignment film
1, 16: polymer support
11: boundary region on photo alignment film side in optically anisotropic film
13: interface between photo alignment film and optically anisotropic film
15: boundary region on optically anisotropic film side in photo alignment film
18: positive C plate
20: polarizing plate
22: polarizer
30: optical film manufacturing process
31, 39: roll
32, 35: die
33, 36: heating device
34, 37: light source
38: backup roll

What is claimed is:

1. An optical film comprising a laminate of, in the following order: a polymer support containing an additive; a photo alignment film; and an optically anisotropic film, wherein the optically anisotropic film is formed of a polymerizable liquid crystal composition containing a polymerizable liquid crystal compound having reverse wavelength dispersibility, and an amount of a component derived from the additive of the polymer support, which is contained in a boundary region with the optically anisotropic film in the photo alignment film is 0.10 to 0.50 mass % with respect to a total mass of the photo alignment film, wherein the boundary region in the photo alignment film is a region from a boundary line between the photo alignment film and the optically anisotropic film to a depth of 50 nm.

2. The optical film according to claim 1, wherein the polymerizable liquid crystal compound having reverse wavelength dispersibility is a compound represented by Formula (1), $$L^1\text{-}SP^1\text{-}(E^3\text{-}A^1)_m\text{-}E^1\text{-}G^1\text{-}D^1\text{-}Ar^1\text{-}D^2\text{-}G^2\text{-}E^2\text{-}(A^2\text{-}E^4)_n\text{-}SP^2\text{-}L^2 \quad (1)$$

in Formula (1), $D^1$, $D^2$, $E^1$, $E^2$, $E^3$, and $E^4$ each independently represent a single bond, —CO—O—, —C(=S) O—, —CR$^1$R$^2$—, —CR$^1$R$^2$—CR$^3$R$^4$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—, where R$^1$, R$^2$, R$^3$, and R$^4$ each independently represent a hydrogen atom, a fluorine atom, or an alkyl group having 1 to 4 carbon atoms, $G^1$ and $G^2$ each independently represent a divalent alicyclic hydrocarbon group having 5 to 8 carbon atoms which may have a substituent, and one or more —CH$_2$—'s of the alicyclic hydrocarbon group may be substituted with —O—, —S—, or NH—, $A^1$ and $A^2$ each independently represent a divalent aromatic hydrocarbon group having 6 to 12 carbon atoms which may have a substituent, or a divalent alicyclic hydrocarbon group having 5 to 8 carbon atoms which may have a substituent, and one or more —CH$_2$—'s of the alicyclic hydrocarbon group may be substituted with —O—, —S—, or NH—, $SP^1$ and $SP^2$ each independently represent a single bond, a linear or branched alkylene group having 1 to 12 carbon atoms, or a divalent linking group in which one or more —CH$_2$—'s of a linear or branched alkylene group having 1 to 12 carbon atoms are substituted with —O—, —S—, —NH—, —N(Q)-, or —CO—, and Q represents a substituent, $L^1$ and $L^2$ each independently represent a monovalent organic group, at least one of $L^1$ or $L^2$ represents a polymerizable group, and in a case where $Ar^1$ is an aromatic ring represented by Formula (Ar-3), at least one of $L^1$ or $L^2$, or $L^3$ or $L^4$ in Formula (Ar-3) represents a polymerizable group, m represents an integer of 0 to 2, and in a case where m is 2, a plurality of $E^3$'s may be the same or different from each other, and a plurality of $A^1$'s may be the same or different from each other, n represents an integer of 0 to 2, and in a case where n is 2, a plurality of $E^4$'s may be the same or different from each other, and a plurality of $A^2$'s may be the same or different from each other, and $Ar^1$ represents any aromatic ring selected from the group consisting of groups represented by Formulae (Ar-1) to (Ar-5),

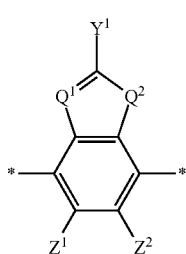

(Ar-1)

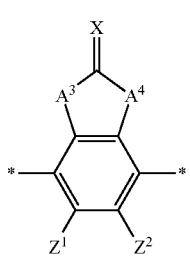

(Ar-2)

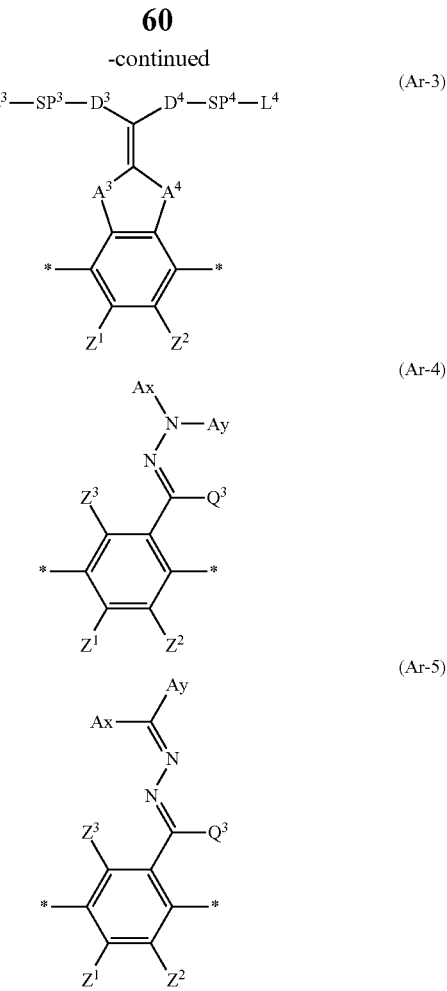

in Formulae (Ar-1) to (Ar-5), * represents a bonding position with $D^1$ or $D^2$, $Q^1$ represents N or CH, $Q^2$ represents —S—, —O—, or —N(R$^5$)—, where $R^5$ represents a hydrogen atom or an alkyl group having 1 to 6 carbon atoms, $Y^1$ represents an aromatic hydrocarbon group having 6 to 12 carbon atoms which may have a substituent, or an aromatic heterocyclic group having 3 to 12 carbon atoms which may have a substituent, $Z^1$, $Z^2$, and $Z^3$ each independently represent a hydrogen atom, a monovalent linear or branched aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —OR$^6$, —NR$^7$R$^8$, —SR$^9$, —COOR$^X$, or —OCOR$^Y$, $R^6$ to $R^9$, $R^X$, and $R^Y$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N(R$^{10}$)—, —S—, and —CO—, where $R^{10}$ represents a hydrogen atom or a substituent, X represents a non-metal atom of Group 14, 15, or 16 to which a substituent may be bonded, $D^3$ and $D^4$ each independently represent a single bond, —CO—O—, —C(=S)O—, —CR$^1$R$^2$—, —CR$^1$R$^2$—

$-CR^3R^4-$, $-O-CR^1R^2-$, $-CR^1R^2-O-CR^3R^4-$, $-CO-O-CR^1R^2-$, $-O-CO-CR^1R^2-$, $-CR^1R^2-O-CO-CR^3R^4-$, $-CR^1R^2-CO-O-CR^3R^4-$, $-NR'-CR^2R^3-$, or $-CO-NR^1-$, where $R^1$, $R^2$, $R^3$, and $R^4$ each independently represent a hydrogen atom, a fluorine atom, or an alkyl group having 1 to 4 carbon atoms, $SP^3$ and $SP^4$ each independently represent a single bond, a linear or branched alkylene group having 1 to 12 carbon atoms, or a divalent linking group in which one or more $-CH_2-$'s of a linear or branched alkylene group having 1 to 12 carbon atoms are substituted with $-O-$, $-S-$, $-NH-$, $-N(Q)-$, or $-CO-$, and Q represents a substituent, $L^3$ and $L^4$ each independently represent a monovalent organic group, and at least one of $L^3$ or $L^4$, or $L^1$ or $L^2$ in Formula (1) represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms which may have a substituent, or an organic group having 2 to 30 carbon atoms, which has at least one aromatic ring selected from the group consisting of an aromatic hydrocarbon ring and an aromatic heterocyclic ring, the aromatic ring in Ax and Ay may have a substituent, and Ax and Ay may be bonded to each other to form a ring, and $Q^3$ represents a hydrogen atom or an alkyl group having 1 to 6 carbon atoms which may have a substituent.

3. The optical film according to claim 1, wherein the photo alignment film is formed of
a photo alignment film forming composition containing a polymer containing a crosslinkable group, and a low-molecular-weight compound having a cinnamate group, or
a photo alignment film forming composition containing a polymer containing a crosslinkable group and a photo-aligned group.

4. The optical film according to claim 1, wherein the polymer support is a cellulose acylate film containing an additive.

5. The optical film according to claim 4, wherein the additive is a polyester compound or a sugar ester compound.

6. The optical film according to claim 4, wherein in the polymer support, an Re (550) is 0 to 10 nm, and an Rth (550) is −10 to 15 nm.

7. The optical film according to claim 1, wherein the optically anisotropic film is provided so as to be peelable from the photo alignment film.

8. A polarizing plate comprising:
the optical film according to claim 1; and
a polarizer.

9. An image display device comprising:
the optical film according to claim 1.

* * * * *